US009246505B2

United States Patent
Aggrawal et al.

(10) Patent No.: US 9,246,505 B2
(45) Date of Patent: Jan. 26, 2016

(54) SYSTEMS AND METHODS FOR ACTIVE CANCELLATION FOR IMPROVING ISOLATION OF TRANSMISSION GATES IN HIGH-FREQUENCY ANALOG TO DIGITAL CONVERTERS

(71) Applicants: Himanshu Aggrawal, Agra (IN); Aydin Babakhani, Houstin, TX (US)

(72) Inventors: Himanshu Aggrawal, Agra (IN); Aydin Babakhani, Houstin, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 0 days.

(21) Appl. No.: 14/596,582

(22) Filed: Jan. 14, 2015

(65) Prior Publication Data

US 2015/0229319 A1 Aug. 13, 2015

Related U.S. Application Data

(60) Provisional application No. 61/927,045, filed on Jan. 14, 2014.

(51) Int. Cl.
*H03M 1/48* (2006.01)
*H03M 1/12* (2006.01)
*H04B 1/04* (2006.01)

(52) U.S. Cl.
CPC ............... *H03M 1/12* (2013.01); *H04B 1/0475* (2013.01); *H04B 1/0483* (2013.01)

(58) Field of Classification Search
CPC .................... H03K 19/018578; G01R 31/3004
USPC .............. 341/112, 155, 110; 333/12, 1.5
See application file for complete search history.

(56) References Cited

U.S. PATENT DOCUMENTS

| | | | | |
|---|---|---|---|---|
| 5,196,137 A * | 3/1993 | Merchant | ............. | C08J 9/144 |
| | | | | 134/12 |
| 6,028,438 A * | 2/2000 | Gillette | ............. | G01R 31/3004 |
| | | | | 324/762.01 |
| 6,407,442 B2 * | 6/2002 | Inoue | ............. | H01L 27/1203 |
| | | | | 257/347 |
| 6,456,552 B1 * | 9/2002 | Hatamian | ............. | G01R 31/3004 |
| | | | | 365/189.12 |
| 7,679,396 B1 * | 3/2010 | Kao | ............. | H03K 19/018578 |
| | | | | 326/27 |

OTHER PUBLICATIONS

Shahramian, S, et al., "A 30-GS/sec Track and Hold Amplifier in 0.13-µm CMOS Technology", IEEE, Custom Integrated Circuits Conference (CICC), pp. 493-496 (2006).
I. Jaesik Lee, et al., "A 50GS/s Distributed T/H Amplifier in 0.18µm SiGe BiCMOS", IEEE Solid-State Circuits Conference (ISSCC), pp. 466-616 (2007).
Babakhani, A, et al., "Transmitter Architectures Based on Near-Field Direct Antenna Modulation (NFDAM)", IEEE Transactions on Wireless Communications, vol. 43 (2009).
(Continued)

*Primary Examiner* — Peguy Jean Pierre
(74) *Attorney, Agent, or Firm* — Winstead PC

(57) ABSTRACT

An active cancellation system may provide a first and second transmission gates that are fed with an input signal and a complimentary signal, respectively. The first transmission gate may be switched on/off, and a second transmission gate may remain off at all times. When switched off, the first transmission gate may provide a leakage signal resulting from leakage in current, especially at high input frequencies, which is detrimental to performance. The complimentary signal fed to the second transmission gate is out of phase with the input signal, but identical in amplitude. Thus, second transmission gate may output a signal that can cancel out the leakage signal from the first transmission gate.

22 Claims, 22 Drawing Sheets

(56) References Cited

OTHER PUBLICATIONS

Babakhani, A, et al., "Near-Field Direct Antenna Modulation", IEEE Microwave Magazine, vol. 10, No. 5 (2010).

Urazghildiiev, I, et al., High-Resolution Estimation of Ranges Using Multiple-Frequency CW Radar, IEEE Transactions on Intelligent Transportation Systems, vol. 8 (2007).

Zhao, P, et al., "A 24GHz Pulse-Mode Transmitter for Short-Range Car Radar", IEEE Symposium on Radio Frequency Integrated Circuits (RFIC) (2007).

Millet, N, et al., "Passive radar air surveillance: Last results with multireceiver systems", International Proceedings on Radar Symposium (2011).

P. Chen and A. Babakhani, "A 30GHz Impulse Radiator with On-ChipAntennas for High-Resolution 3D Imaging," IEEE Radio and Wireless Symp. (RWS), San Diego, CA, Jan. 2015.

Ziegler, V.; Schubert, F.; Schulte, B.; Giere, A.; Koerber, R.; Waanders, T., "Miniaturized helicopter near field obstacle warning radar: Sensor system performance and flight tests," Microwave Symposium (IMS), 2014 IEEE MTT-S International, vol., No., pp. 1,4, Jun. 1-6, 2014.

\* cited by examiner $F_{in}$=1GHz
$F_s$=40GS/s

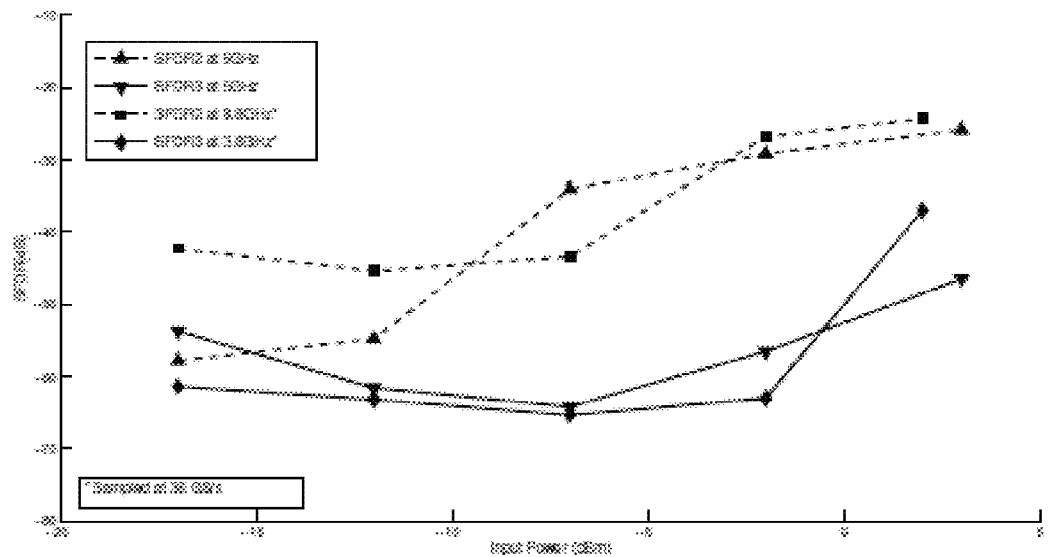

FIG. 21B

| IC Specifications | This work | [1] | [2] |
|---|---|---|---|
| Process | 45nm SOI CMOS | 130nm CMOS | 180nm SiGe BiCMOS |
| Die specifications | 850μm x 450μm, 15 pins | 1 mm2 | 1.28 x 1.15 mm² |
| Supply Voltage | 2.5V, 1V | 1.8V | 4V, 3.3V |
| Power consumption | 415mW | 270mW | 640mW |
| Sampler | | | |
| Input | Single-ended | Differential | Differential |
| Maximum Sampling Rate | >40GS/s | 30GS/s | 50GS/s |
| SFDR3 | >62dB@ Fin=5GHz, Fs=40GS/s | SFDR=40dB@ Fin=1GHz, Fs=30GS/s | SFDR=42dBc@Tone=30,30.1GHz, Fs=40GS/s |
| SFDR2 | >55dB@ Fin=5GHz, Fs=40GS/s | | |
| Isolation | >30dB @ Fin=1GHz | Not reported | Not reported |
| Droop Voltage | 20μv/ns | 10 mV/ns | Not reported |

FIG. 22

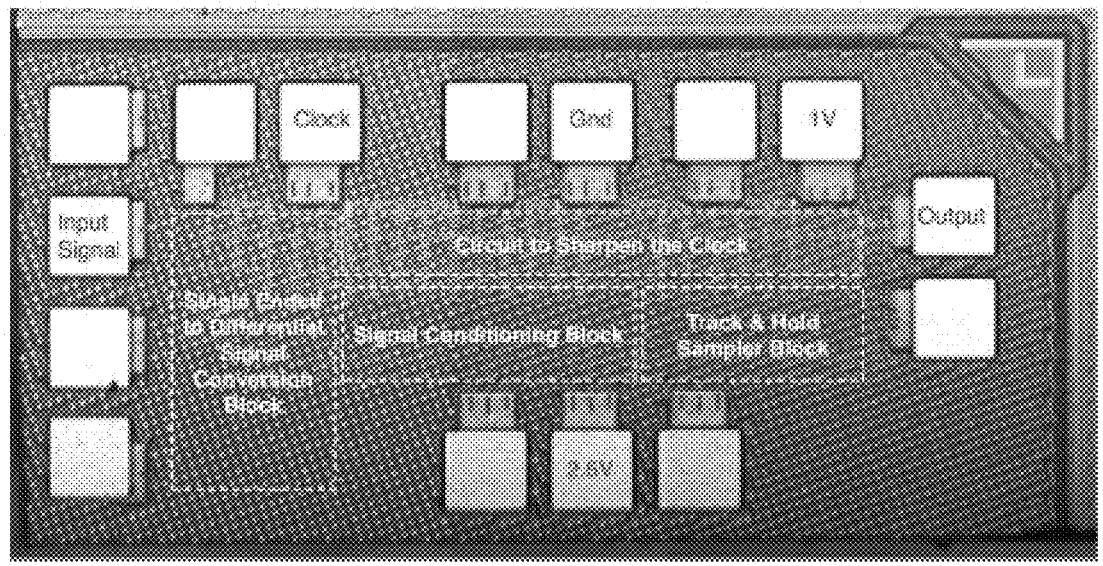

FIG. 23

SYSTEMS AND METHODS FOR ACTIVE CANCELLATION FOR IMPROVING ISOLATION OF TRANSMISSION GATES IN HIGH-FREQUENCY ANALOG TO DIGITAL CONVERTERS

RELATED APPLICATIONS

This application claims the benefit of U.S. Provisional Patent Application No. 61/927,045, filed on Jan. 14, 2014, which is incorporated herein by reference.

FIELD OF THE INVENTION

This invention relates to improving isolation of transmission gates in high-frequency analog to digital converters (ADCs). More particularly, to utilizing active cancellation to improve isolation.

BACKGROUND OF INVENTION

The need for high speed wireless and optical links is increasing every day and one of the bottle necks is the availability of high speed analog to digital converters (ADCs). These ADCs form the front end of almost every digital system. Several fields from defense to communication to aviation can all benefit from a faster ADC. Moreover, with the rise of wide-bandwidth pulse-based systems, a wide-bandwidth ADC is desirable for an impulse receiver. Over the course of time, ADCs have evolved and many different topologies have been adapted from sample and hold to track and hold to master-slave configuration and many more, all with the objective to improve the performance. Furthermore, to get a superior performance figure, designers have often focused on using expensive InP or GaAs fabrication processes.

A time domain wide-bandwidth pulse based system architecture mitigates/eliminates some of the inherent drawbacks of narrow-band continuous wave (CW) systems. Such systems may utilize time domain pulses for communication and localization. Being a pulse based architecture, the system is ultra wide-band and uses a single pulse for each transmitted symbol. Moreover, the ability to coherently combine the pulses at specific point adds a layer of spatial encryption and power combining, which is difficult in CW architecture.

Analog to digital converters (ADCs) converts the continuous physical quantity to digital bits that represents its amplitude. The conversion involves quantization of parameters thus introducing some error. In order to make an on-chip wide-bandwidth pulse based communication and localization systems, it is very important to have an ultra wide-band high-speed ADC core around which receivers can be built.

ADCs:

ADCs may use sample & hold techniques in which the input signal is captured and the value is held for a specific period of time, acting as temporary memory devices. An exemplary sample & hold circuit may comprise a charge storing element like capacitor, a fast transmission switch and a high input impedance amplifier. As shown in FIG. 1, a capacitor 10 is connected to the input via switch ($S_1$) 20. When this switch 20 is closed, the voltage across the capacitor 10 is proportional to the average voltage applied during the "ON" time and duration of "ON" time. Knowing the duration of "ON" time, the average voltage across the capacitor can be calculated and hence sample the input signal. This architecture works very well for lower frequency spectrum and low sampling rate. However, as we increase the input frequency, many technical challenges arises.

Switch Isolation:

While implementing a switch in CMOS, a transmission gate may be utilized, such as an exemplary transmission gate shown in FIG. 2. This transmission gate is composed of a P-MOS 210 and N-MOS 220 in parallel (FIG. 2) which is fed by a clock' ($\overline{A}$) and clock (A). Ideally, the transmission should provide infinite impedance when switched "OFF", which is generally true for lower frequencies. However, as we increase the frequency, the isolation decreases as shown in the frequency response (FIG. 3) of a transmission gate in 45 nm technology (both transistor are in "Off" state). This phenomenon can be explained with the fact that the source(S) drain (D) parasitic capacitor ($C_{SD}$) provides an alternate path for the signal to pass as shown in FIG. 2. This alternate path provides considerable about of coupling at high frequencies and reduces the isolation.

Limitation of Sampling Window:

Sampling window in an ADC is defined as the window during which the sampling of the signal is taking place, as illustrated in FIG. 4. For example, suppose a sample of the signal at point "X" is desired. The switch-1 starts to switch on at t=0 and completely switches on after t=$t_{rise}$. The switch remains on for duration $t_{duration}$ and then starts to switch off with the closing time of $t_{fall}$. Assuming that $t_{rise}$ and $t_{fall}$ are comparably smaller than $t_{duration}$, then the voltage across the capacitor is proportional to the mean of the time-varying input signal. When $t_{duration}$ is long, the input signal can vary and cause a large error on the sampling voltage. To minimize this error, $t_{duration}$ is preferably small. This means the switch and the holding capacitors should be very small. However, when the holding capacitor is small, the leakage current during the "OFF" can easily change the voltage on the holding capacitor and cause a large error, which is discussed further below.

Leakage Current During "OFF" State:

After the sampling is done, the switch-1 is closed and the voltage across the capacitor is read by a high impedance amplifier, but this process is usually much longer than $t_{duration}$ and the leakage current caused by the switch can change the voltage during the "OFF" stage and increase the error. For example, as shown in FIG. 5, voltage output ($V_o$) from a transmission gate may be non-zero due to incomplete isolation and leakage current.

In new architecture discussed herein, a new concept is provided in which the accuracy of sampling window of ADC can be increased, by providing active cancellation in the transmission gate. This active-cancellation eliminates the leakage current from the input when the switch is OFF, thus increasing isolation even at higher frequencies.

Further, a broadband time-domain pulse-based directional antenna modulation architecture is also disclosed herein. The architecture may utilize multiple transmitters synchronized at the symbol level to generate a narrow information beamwidth.

SUMMARY OF THE INVENTION

In one embodiment, an active cancellation system may provide a first and second transmission gates that are fed with an input signal and a complimentary signal, respectively. The first transmission gate may be switched on/off, and a second transmission gate may remain off at all times. When switched off, the first transmission gate may provide a leakage signal resulting from leakage in current, especially at high frequencies, which is detrimental to performance. The complimentary signal fed to the second transmission gate is out of phase with the input signal, but identical in amplitude. Thus, second transmission gate may output a signal that can cancel out the leakage signal from the first transmission gate.

In another embodiment, a track and hold circuit may include a capacitor connected to an input signal via switch ($S_1$). When this switch is kept closed for relatively longer time, the voltage across the capacitor is same as the input if the capacitor is small. The voltage across the capacitor will be almost equal to input (i.e. it will track the input). When we switch off the switch ($S_1$), the voltage across the capacitor is very close to the sampling point voltage if the switch is very fast and the leakage during the off stage is considerably low. As the frequency content of the input signal increases, the sampling window should decrease to keep the error small.

In yet another embodiment, a pulse-based communication system provides two or more transmitters and a receiver. The two or more transceivers may each transmit a semi-symbol. These semi-symbols may be combined to form a complete symbol or signal that is received by the receiver.

In yet another embodiment, a pulse-based localization and imaging system provides two or more transmitters and a receiver for locating a desired object. Signals may be transmitted from the transmitters to the desired object and reflected to the receiver. The time of flight and total travel path distance may be calculated. A total distance from two points, which is a constant, may be plotted to form an ellipse. This may be done for multiple transceiver pairs. By determining the intersection point between two or more ellipses, the direction and distance of the desired object may be determined.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 20A-20B shows measured time domain waveform of a 1 GHz input signal with real time sampling frequencies of 20 GS/s and 40 GS/s;

FIGS. 21A-21B show measured SFDR2 and SFDR3 versus sampling frequency and measured SFDR2 and SFDR3 versus input signal power at sampling frequency 40 GS/s;

FIG. 22 shows a comparison table with other devices;

FIG. 23 shows a chip micrograph at 45 nm;

DETAILED DESCRIPTION

Figure 1:
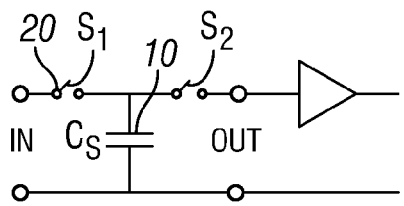
FIG. 1 is an illustrative embodiment of an analog to digital converter sample and hold or a track and hold circuit.
Figure 2:
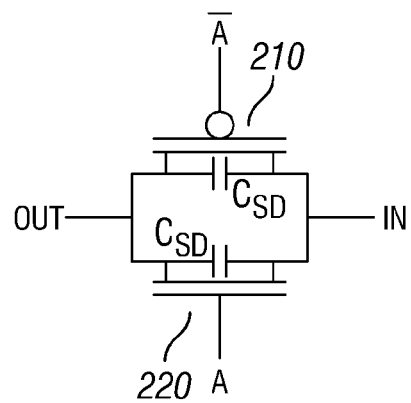
FIG. 2 is an illustrative embodiment of a transmission gate with a p-mos and n-mos in parallel.
Figure 4:
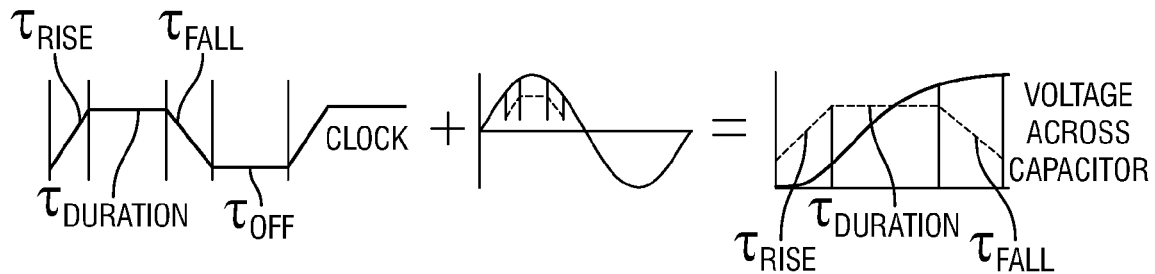
FIG. 4 is an illustrative embodiment of a sampling window.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Systems and methods for active cancellation for improving isolation of transmission gates in analog to digital converters (ADCs) are discussed herein. Leakage current is one the major causes of error and the cause for the need for a high-speed switch with a low-leakage current during the "OFF" (hold) state. In some embodiments, a first transmission gate or CMOS may receive a first input and clock signals that switches the CMOS on/off. Leakage current from the first CMOS when it is switched off may result in an undesirable and unintended voltage output from the first CMOS, especially at high frequencies.

Active cancellation systems and methods may add a second CMOS that is fed with a second signal that is out of phase with the first input signal, but identical in amplitude, or a negative of the first input signal. The second CMOS may remain off. The voltage output from the second CMOS may be out of phase, but nearly identical in amplitude to the undesirable voltage output from the first CMOS caused by leakage current. This voltage output from the second CMOS may be utilized to completely cancel or significantly reduce the undesirable voltage output from the first CMOS caused by leakage current.

To explain in detail, discussions of 1) active cancellation technique, 2) modifying track & hold technique, and 3) generation of pico-second rise/fall time clock are provided below.

Figure 3:
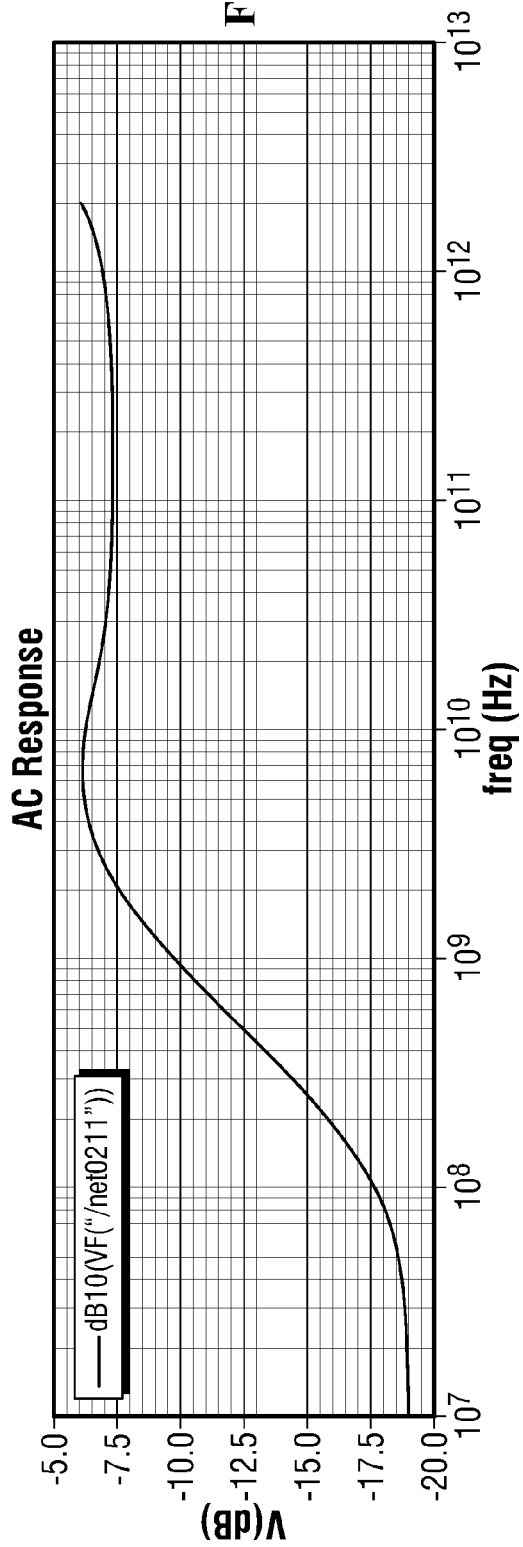
FIG. 3 is an illustrative embodiment of the frequency response of a transmission gate during the "OFF" stage, which shows that the isolation becomes small (worse) at higher frequencies.
Figure 5:
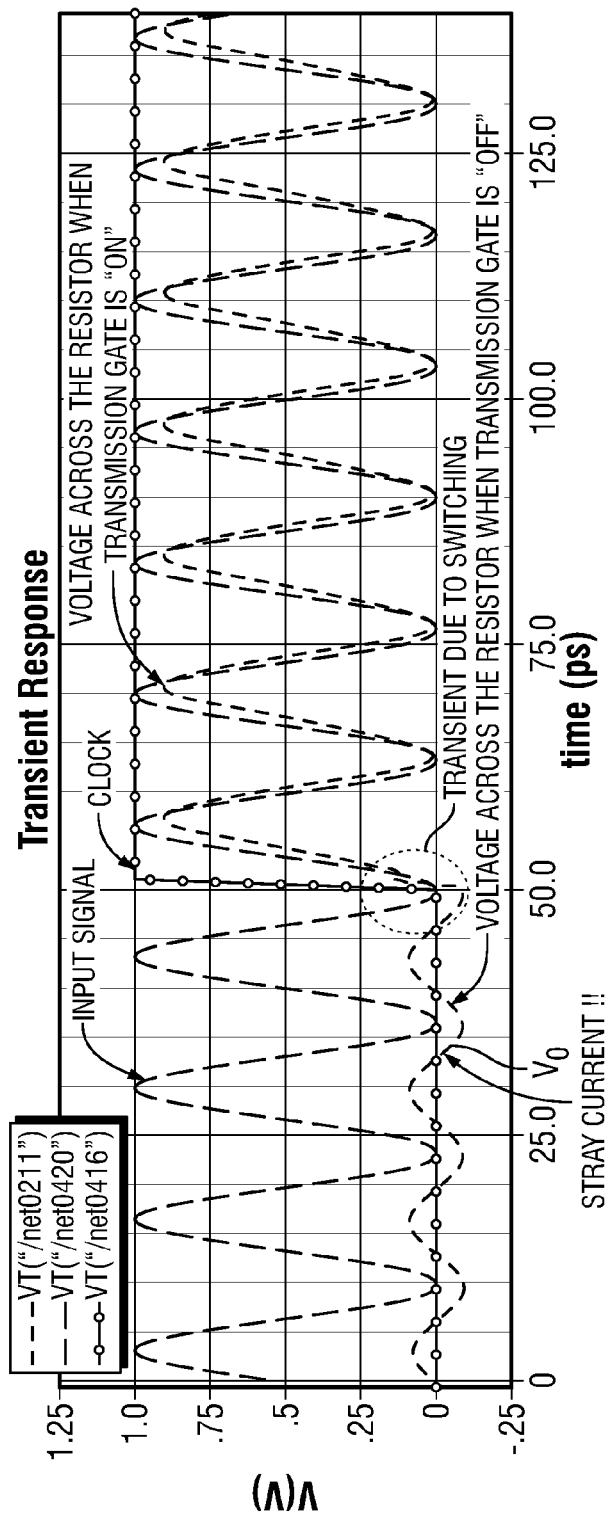
FIG. 5 is an illustrative embodiment of the transient response of a transmission gate demonstrating leakage during an off stage at high frequencies.

Active Cancellation Technique:
Need for Active Cancellation:

As discussed previously, the transmission gate is one of the key building blocks for track and hold circuits of ADCs. They act as switch to separate the capacitor for the input signal during the sampling stage. However, as pointed out earlier, the transmission gate does not act as an ideal switch since it does allow some leakage during its "OFF" stage for relatively higher frequencies, such as frequencies equal to or greater than 1 GHz. This leakage in current determines the minimum quantization error, thus serving as a bottleneck for very small sampling window ADCs. This phenomenon is quite evident in FIG. 3 showing the transient response of the transmission gate when switched "On" & "Off." FIG. 3 shows there is a considerable amount of coupling between the input and output when the transmission gate is in off state at high frequencies or frequencies equal to or greater than 1 GHz.

Implementation of Active Cancellation:

An active cancellation circuitry is designed to maximize the isolation between the input signal and the holding capacitor in the hold mode. To achieve active cancellation, a signal and a replica of the signal that is out of phase, but of the same amplitude, is desired. When these two signal are combined, they tend the annihilate each other or cancel out. The more accurate the negative copy of input signal generated, the more accurately the two signals will annihilate each other.

Figure 6:
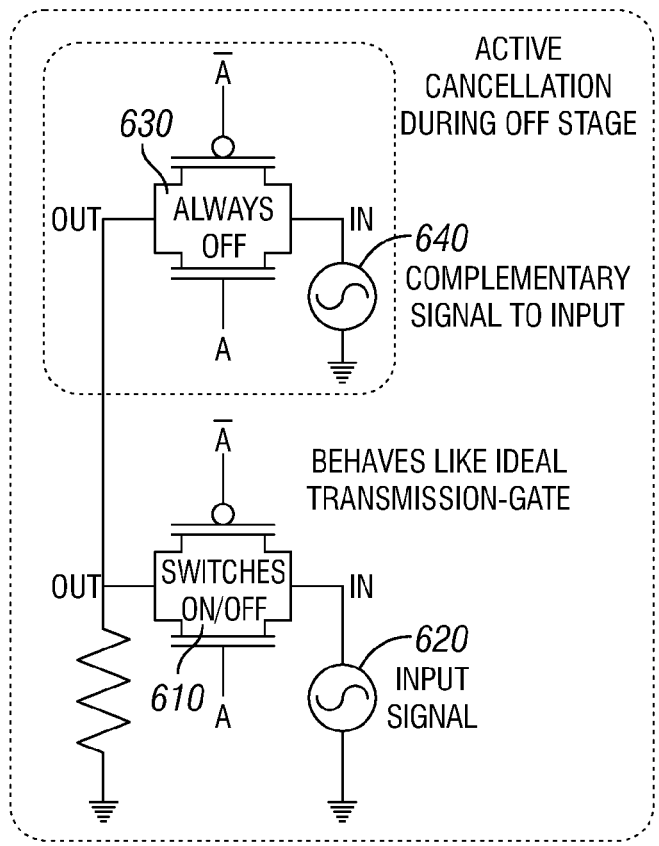
FIG. 6 is an illustrative embodiment of a transmission gate with active cancellation.
Figure 7:
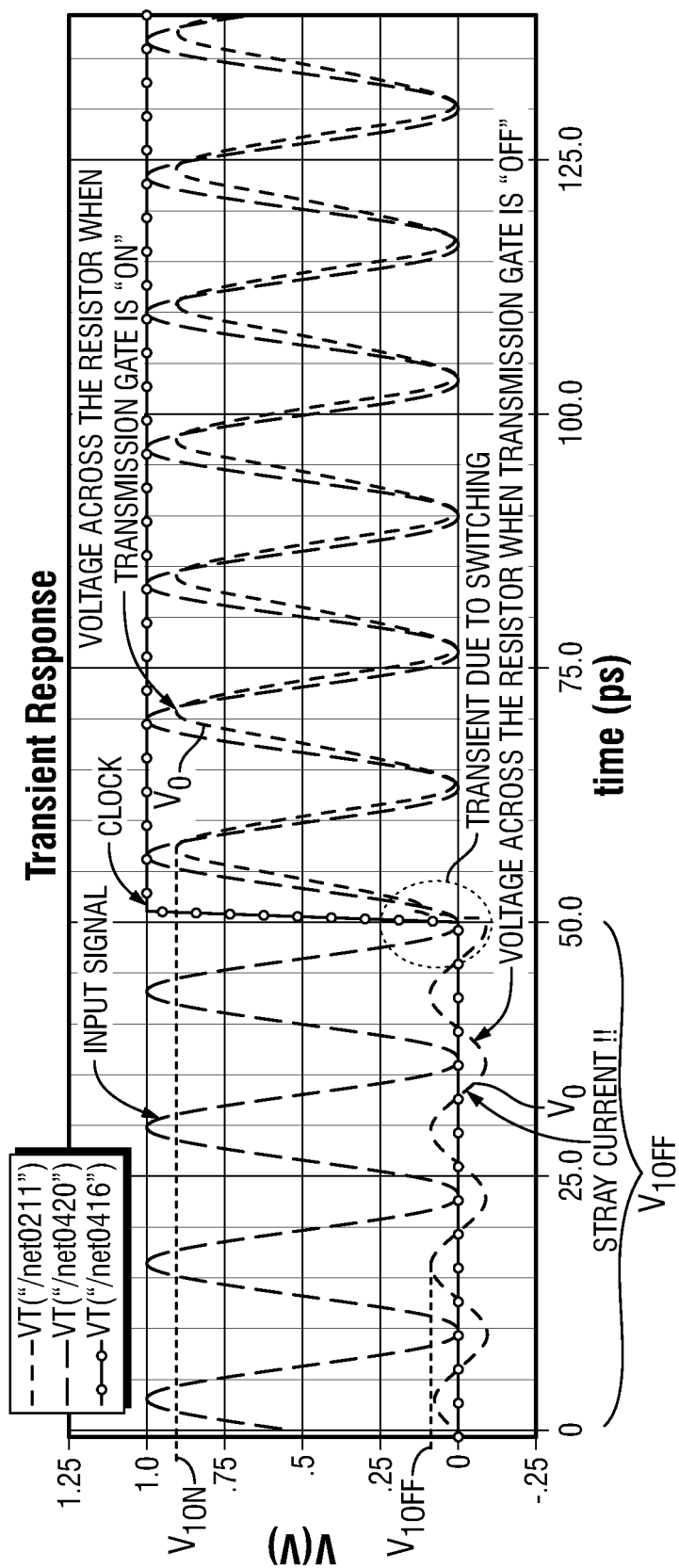
FIG. 7 is an illustrative embodiment of the transient response of transmission switch-1.

Implementation of Active Cancellation in CMOS:

The above described concept can be used to cancel a waveform in the electronic domain. FIG. 6 is an illustrative embodiment of an active cancellation system. A first transmission switch (switch-1) 610 is fed with an input signal 620. Transmission switch-1 610 may be switched on/off. A second transmission gate (switch-2) 630 may receive a negative or complimentary signal 640 of the input signal 620, and switch-2 remains off at all times. Switch-1 610 and switch-2 630 are controlled or switched on/off with the clock (A) and clock' (A). Both the first 610 and second 630 transmission gates output to a buffer 650, such as a capacitor, resistor, or the like, so that the output of the two gates are combined. As shown in FIG. 7 (shown with input signal of 75 GHz), when a transmission gate (e.g. switch-1 610) is switched on, the voltage output or voltage across the resistor ($V_o$, right side) is almost same as that of the input (e.g. $V_{1on}$ close to ideal). However, when gate is switched off, the voltage across the resistor ($V_{out}$, left side) is not zero, but considerable percentage of the input signal (e.g. $V_{1off}$). This is due the lack of perfect isolation.

Figure 8:
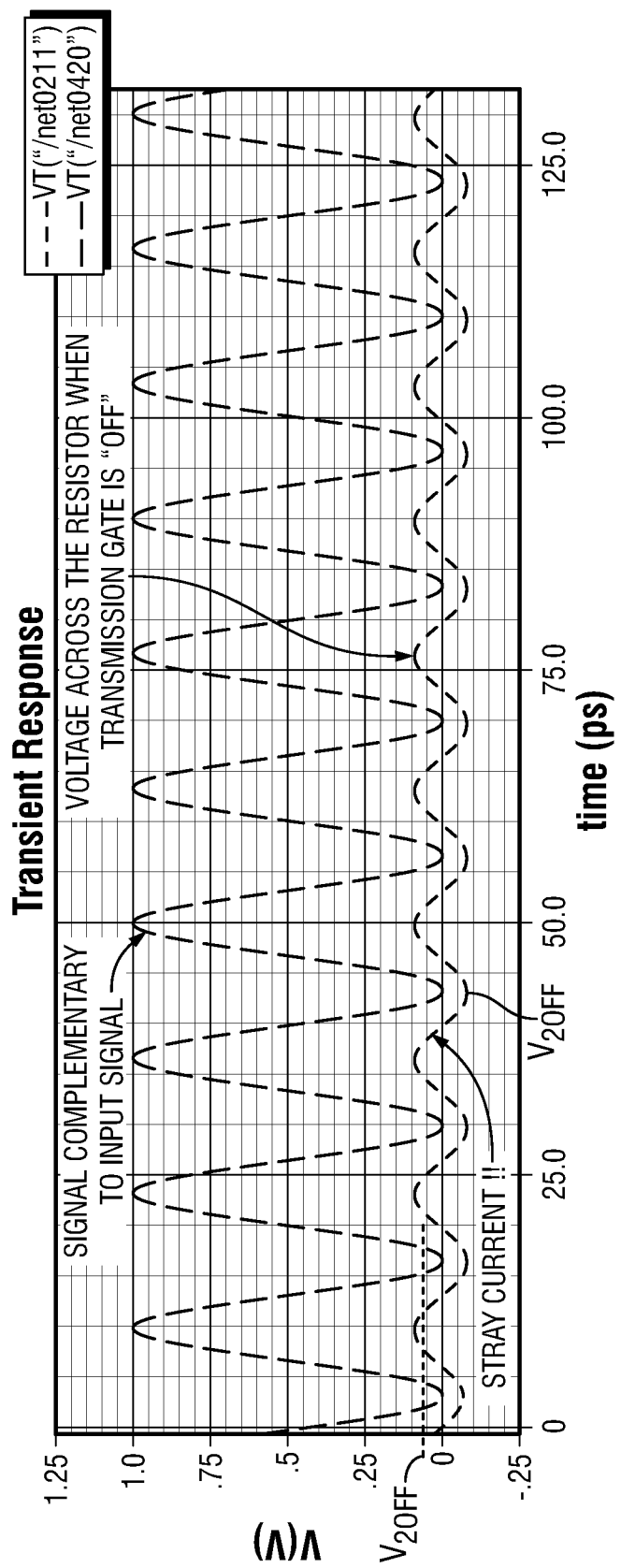
FIG. 8 is an illustrative embodiment of the transient response of transmission gate-2.

In active cancellation, transmission switch-2 630 may be fed with complimentary signal that is out of phase to the input signal fed to transmission switch-1 610, but identical in amplitude. As shown in FIG. 8, transmission switch-2 630 may always be kept in the off stage so that the output current of switch-2 can cancel the leakage current of switch-1 610 when both the transmission switches 610, 630 are feeding the same buffer 650 (the input impedance of the buffer is approximated by a resistor. A holding capacitor can be also added in parallel to this resistor without affecting the discussion). As a result, during the state when switch-1 610 is "On" and switch-2 630 is "Off" the voltage across the resistor is proportional to the current output of switch-1 610 in the "On" state plus the current output of switch-2 630 in the "Off" state. When both switches are "Off" the voltage across resistor is proportional to the current output of switch-1 610 in the "Off" state plus the current output of switch-2 630 in the "Off" state, which is approximately zero because the two outputs cancel each other. This technique helps to convert a non-ideal transmission gate to an ideal one.

Figure 9:
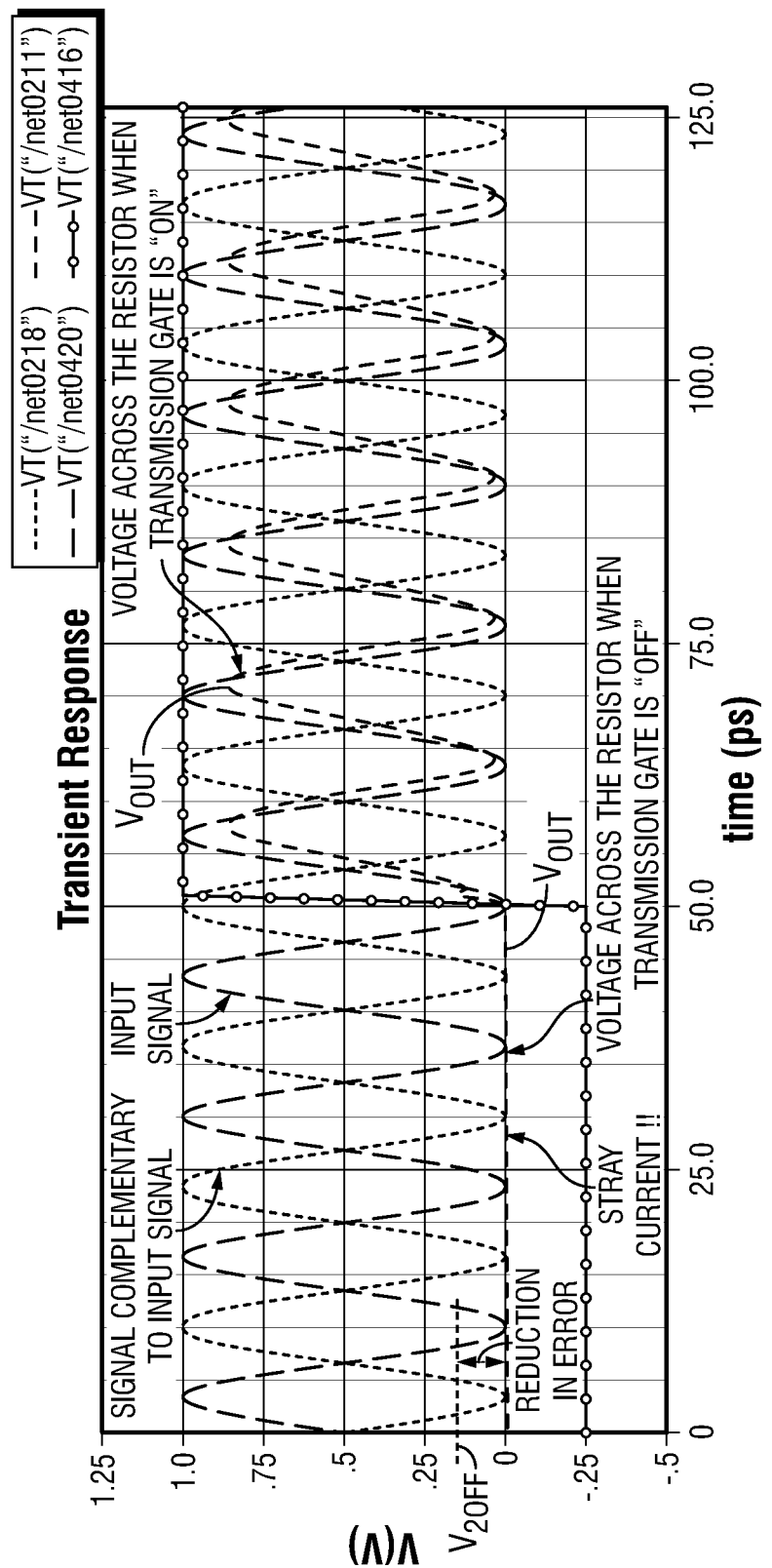
FIG. 9 is an illustrative embodiment of the combined transient response of the transmission gate with active cancellation shown in FIG. 6.

As shown in FIG. 9, leakage currents from switches 1 and 2 cancel each other out when both transmission gates are off, thereby reducing error or completely eliminating it in the combined voltage output. From a comparison of FIGS. 7 and 9, it can be clearly seen that $V_{out}$ remains at nearly zero voltage (left side of FIG. 9, $V_{out}$) when both transmission gates are off in an active cancellation system, instead of a non-zero voltage (FIG. 7, $V_{out}$ left side) that follows the input signal due to imperfect isolation in a system without active cancellation. When switch-1 610 is "On," the voltage output signal (right side of FIG. 9) mimics the input signal as expected in a sampling component of an ADC.

Figure 10:
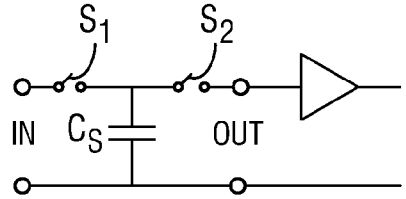
FIG. 10 is an illustrative embodiment of a track and hold topology.

FIG. 10 is an illustrative embodiment of a track and hold topology. In sample and hold (FIG. 1): Switch ($S_2$) is off and switch ($S_1$) is on during the sampling, and then $S_2$ is on and $S_1$ is off during hold. In track and hold (FIG. 10): $S_2$ is always on, and $S_1$ is on during track but off during hold. The switch-1 610 discussed above is the same as $S_1$.

Figure 11A:
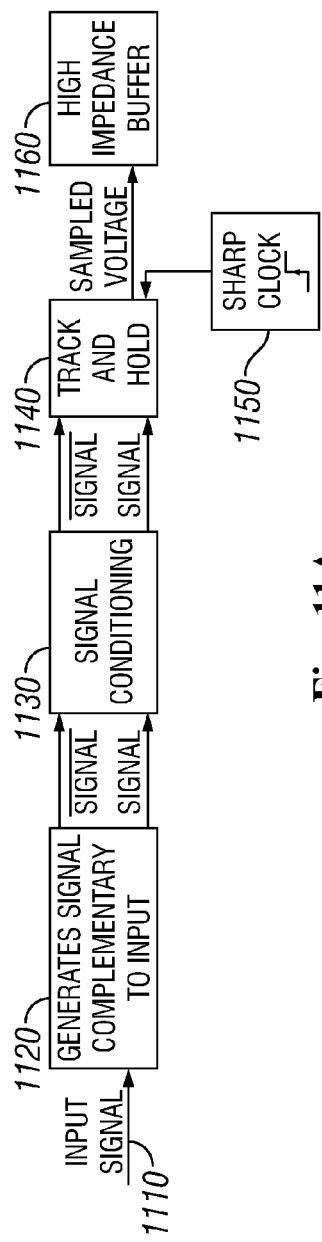
FIGS. 11A-11B are an illustrative embodiment of a block diagram of a track and hold architecture and a detailed diagram of the track and hold block.
Figure 11B:
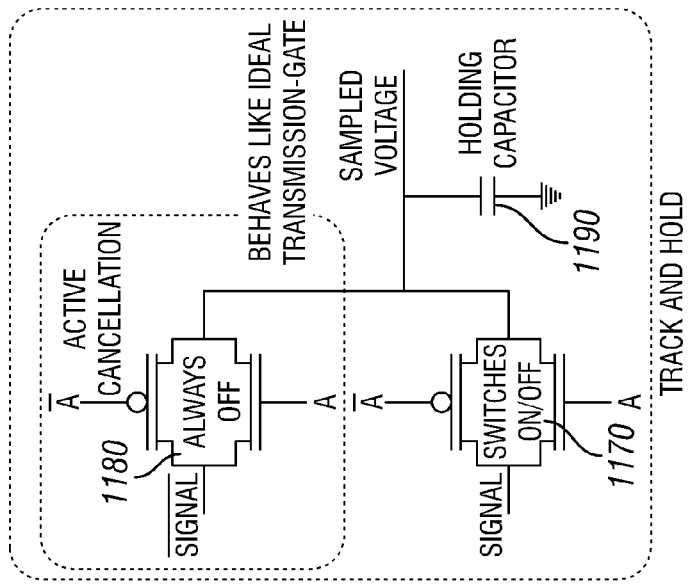
Figure 12:
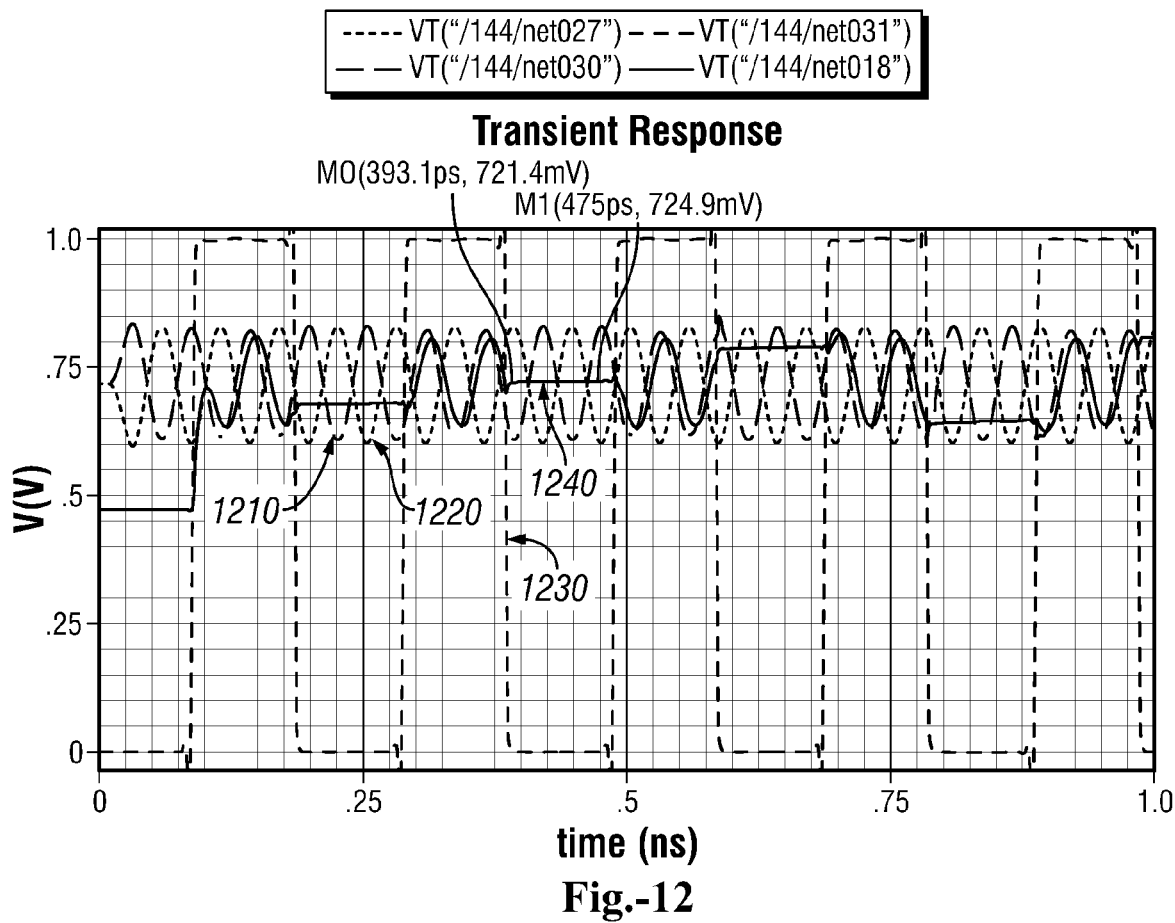
FIG. 12 is an illustrative embodiment of a complete process of sampling.

Implementation of Proposed Architecture:

FIGS. 11A-11B is an illustrative embodiment of a block diagram of a track and hold architecture. The input signal 1110 enters from the left and goes though the differential pair generation block 1120 that generates an identical signal to that of input, but opposite in phase. Once the input signal and its opposite complementary signal are generated (e.g. 1210 and 1220 in FIG. 12), it passes through signal condition block 1130, which accounts for amplitude and phase imbalance or makes the amplitude of both signals the same and assures the signals have opposite phasing. Once both signals are truly complementary over a wide range of frequency spectrum, the signals pass through the track and hold block 1140. Inside the track and hold block 1140 shown further detail in FIG. 11B, the original signal (Signal) is fed to the first switch 1170 that switches on/off in accordance with the fed clock, while the opposite complementary signal ($\overline{\text{Signal}}$) is fed to the second switch 1180 for active cancellation that remains off. The clock 1150 may be utilized to provide clock signals (e.g. 1230 in FIG. 12) to track & hold block 1140. The outputs of both switches (e.g. 1240 in FIG. 12) are then fed to the hold capacitor 1190, which retains the charge during the sampling stage, and finally the voltage across the capacitor is read by a high input impedance amplifier 1160. Referring to FIG. 12, it can be seen that when the first switch is in an on state, the combined output signal from both switches 1240 tracks the input signal 1210. When the first switch is switched to an off state, the combined output signal from both switches 1240, which is almost equal to the input signal 1210, is sampled and held at the sampling point voltage or the initial voltage when sampling began.

Figure 13:
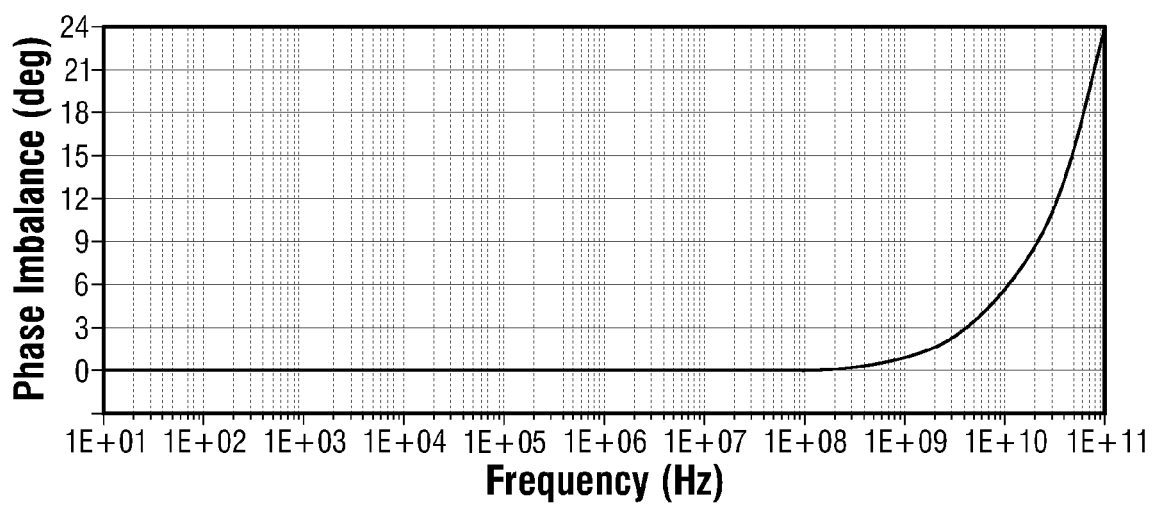
FIG. 13 shows complementary signal phase imbalance in simulation.
Figure 14:
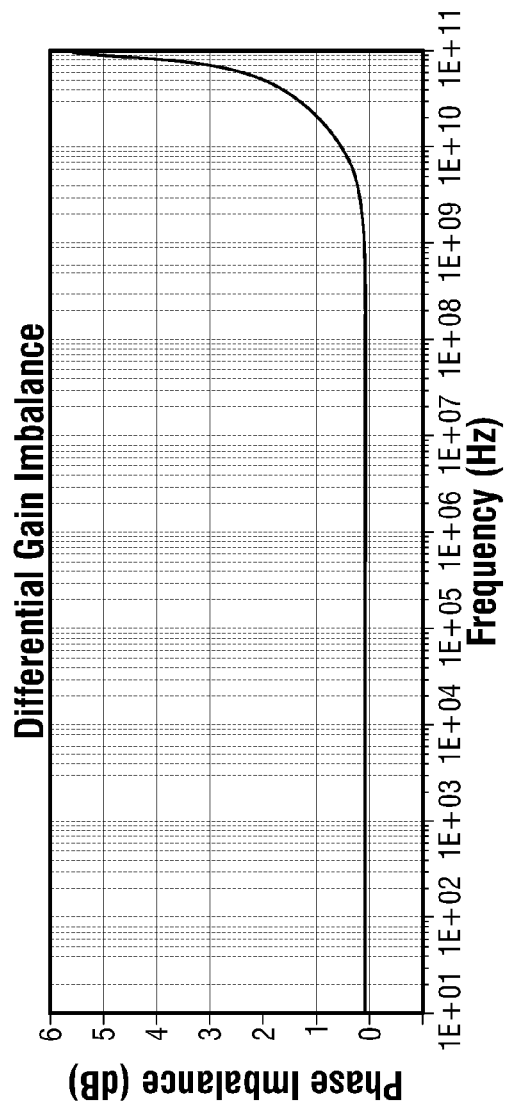
FIG. 14 shows complementary signal gain imbalance in simulation.

Generation of Differential Signal:

An active cancellation architecture needs the original input signal and its negative or complementary copy. To generate the complementary signal, an on chip single ended to differential circuit is used. This differential circuit comprises of a differential amplifier which converts the single ended input signal to differential output. The differential output signals have a lot of phase and amplitude imbalance as shown in the complementary signal phase imbalance simulation in FIG. 13. In order to reduce this imbalance over a wide range of frequencies, the differential signals are passed through a signal condition block that equalizes the amplitude of the input and the complementary copy, and may also ensure the input and complementary copy have opposite phases. This block comprises multiple differential amplifiers in series with a voltage follower buffer to decouple subsequent stage loading. The high CMRR (Common Mode Rejection Ratio) of the differential amplifiers reduces the amplitude and phase imbalance of the differential signal. FIG. 14 shows the phase and gain imbalance after the final stage during simulations. In simulation, the 0.5 dB amplitude imbalance occurred at 10 GHz and a phase imbalance of less than 6 degrees at 10 GHz.

Complementary Clock Generation and Sharpening:

To operate the transmission switch, a clock (clk) and its complementary signal (clk0) are required. Since we are dealing with clock whose rise/fall time is in sub 10 pico-second domain, it may be difficult to generate two different clocks and sync them. Generation of complementary clock from the original clock may be more easily achieved. For example, a single ended 40 GHz external clock may be provided which is converted into two complementary clocks with sub-10 ps rise time. First, the clock is passes through a series of NOT gates to sharpen the pulse, then the clock is branched out into two branches each comprising NOT gate in series with one of the branches having an extra gate which generates the complementary clock (clk'). Since one of the branch has an extra NOT gate there is a delay between the two clocks. This delay may be compensated for by making one of the NOT gate with less powerful (e.g. fewer transistors), which increases the transmission time, thus appropriately compensating the delay. The fewer the number of transistors, the more time will it takes to drive the gate capacitance of the preceding NOT gate. Thus, by changing the number of transistors, the delay can be appropriately compensated. In simulation, the delay was compensated with picosecond accuracy.

Track & Hold:

In FIG. 12 the complete process of sampling is shown. The input waveform is shown as a solid line 1210 while the complementary generated waveform as a dotted line 1220. An output waveform 1240 shown as a solid line tracking the input shows the voltage across the holding capacitor with high impedance amplifier connected to it. As can be seen in FIG. 12, when the clock 1230 is in state "1", the voltage of the capacitor follows the input, but when the clock switches to state "0", the voltage across the capacitor remains constant as the track and hold circuit with active-cancellation behaves close to ideal switches so there is almost no voltage coupling to the input waveform. Moreover, since there is almost no coupling during the off stage, the voltage across the capacitor is not affected by the changing input. Thus, the sampled voltage across the capacitor almost remains constant.

Figure 15:
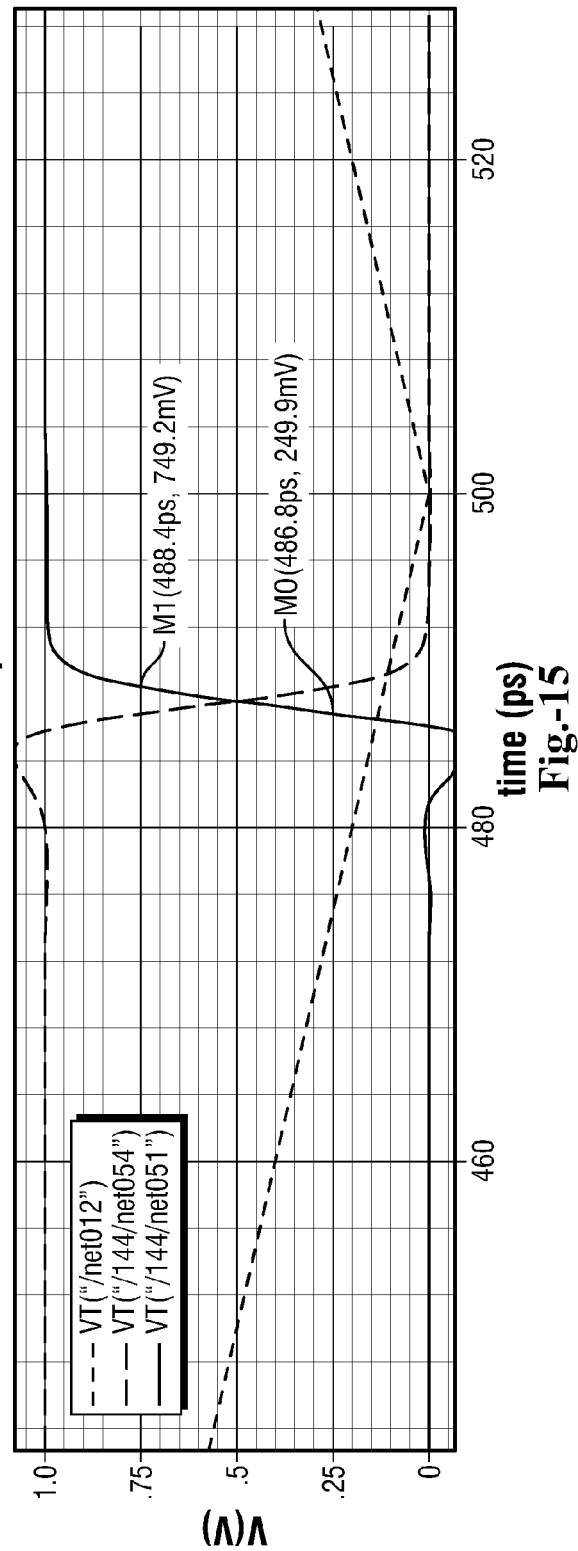
FIG. 15 is an illustrative embodiment of two complementary clocks.

Clock:

FIG. 15 shows the two complementary clocks used in this sampling process. The sharpening of the clock was provided by passing the initial clock (red) through a series of NOT gates.

Advantages of Proposed Architecture:

1. Architecture of Ideal Transmission Gate:

With the proposed architecture, it has been shown that using active cancellation allows the leakage current of a transmission gate to be mitigated (or close to eliminated), thus making it behave like an ideal transmission gate, which is particularly important at higher frequencies. This ideal transmission gate can be used various applications allowing circuit designers to make more sophisticated and faster circuits.

2. Increased Accuracy:

The application of transmission gates with active cancellation can be seen in ADCs. With increased isolation in proposed architecture, hold voltage (voltage across the capacitor during the holding stage) is less prone error from leakage from the input signal, thus making the measurement more accurate and reducing the error.

3. Reduced Sampling Window:

There are two positive contributing factors that allow the duration of the sampling window to be decreased.

Increased Isolation:

Due to increased isolation with the proposed architecture, the holding voltage is less pertinent to input signal, thus the need to do fast voltage read is not very crucial. Usually, fast voltage reading circuits draw a large current, which in turn requires large holding capacitors to provide the current without much change in the voltage, thereby eventual leading to large sampling widows as large capacitors need larger time to charge. Thus, by using this proposed architecture, we can mitigate/eliminate this chain effect.

4. Increased Frequency Response:

The proposed architecture works very well, especially at higher frequencies (e.g. 1 GHz or higher). Thus, this architecture can be used to design ADCs for very high frequency input signal, thus exploring new domains which were previously unheard off.

It should be noted that:

- Any area that require transmission gate can benefit from this track and hold architecture.
- ADCs usually use transmission gate in their architecture, and mostly all mixed signal interface use ADCs, thus broadening the scope of influence with this invention.
- The new architecture mitigates the effect of leakage current at higher frequencies.
- The mitigated leakage current effect helps improve the accuracy of ADCs.
- The new architecture facilitates designing ADCs for higher input frequencies, which was extremely difficult to achieve due to high frequency leakage current.
- High frequency, low error ADCs can be used to make very fast real time system in RF domain.
- Since this device has the capability to sample wide-bandwidth pulses, it can be used for applications requiring high sampling rates or small sampling windows, such as in RF imaging for bio-medical application or military purposes.

High sampling rate ADCs at higher frequencies opens a domain for very secure communication systems that are hard to otherwise decode with standard methods.

Radio Astronomy benefit from very fast sampling ADCs to record events with short duration.

Integration of Optical domain with on chip electronics will be much more feasible with high speed interface like proposed ADCs.

Figure 16:
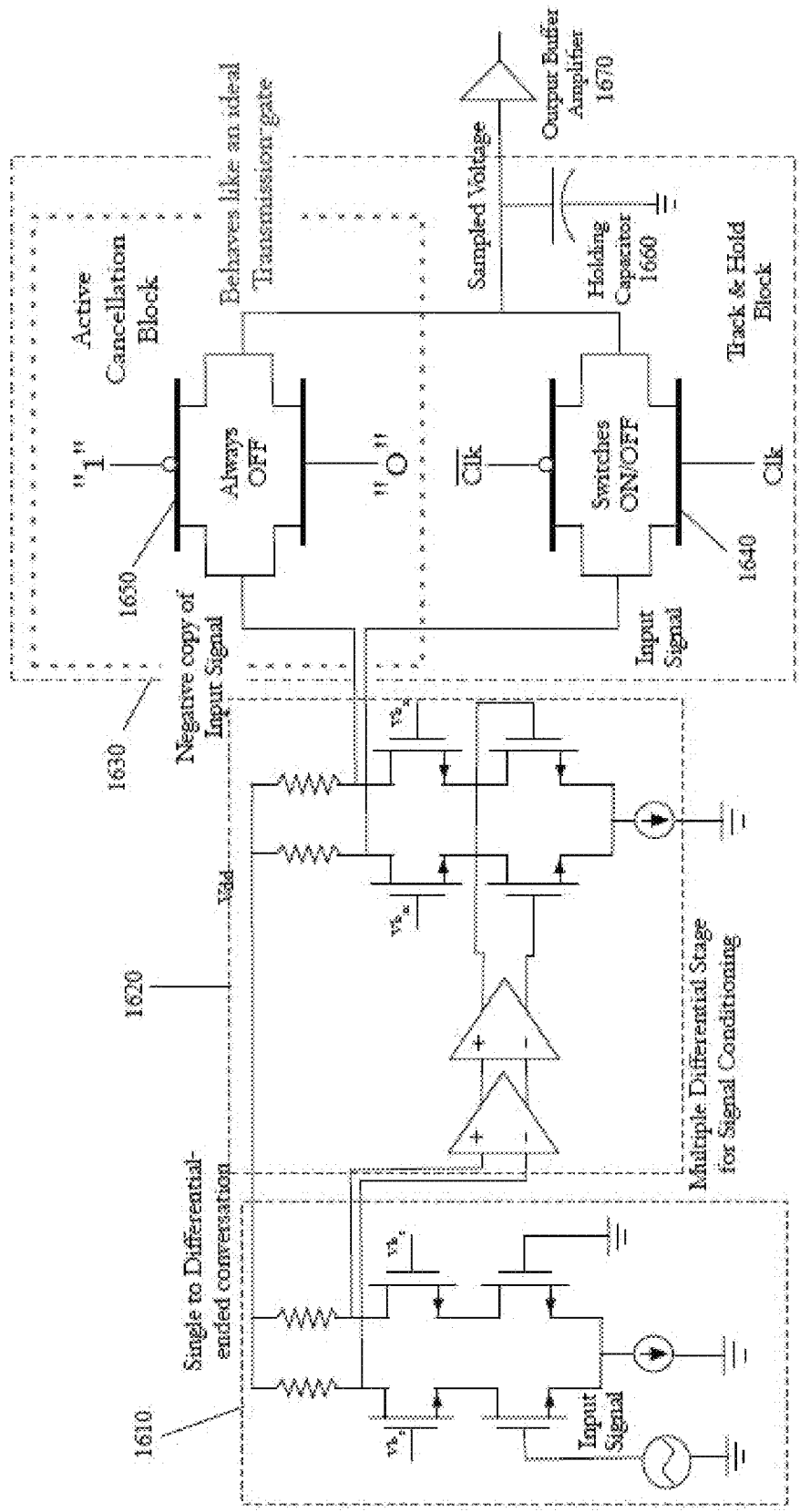
FIG. 16 is an illustrative embodiment of a schematic of T/H circuit with active-cancellation.

FIG. 16 is an illustrative embodiment of a detailed circuit diagram of a Track and Hold (T/H) amplifier with active cancellation. A signal-ended RF signal is fed to a differential amplifier 1610, which converts the input signal to a differential pair, one being the negative copy of the other. In some embodiments, it is preferred that this generated pair has the same amplitude and 180° phase difference in all input frequencies. However, due to non-ideal circuits, the generated pair may have a large phase and amplitude imbalance. To reduce this imbalance, the complementary pair may be passed through a signal conditioning circuitry 1620 comprising multiple stages of differential amplifiers and voltage follower (e.g. three stages). The 3 dB bandwidth of the combined system is 50 GHz in simulation. At the output of signal conditioning block 1620, the differential pair has an amplitude imbalance of 3 dB and phase imbalance of less than 10° at 100 GHz.

After the signal conditioning block 1620, the differential pair, which includes of the main signal and its negative copy, is passed through a T/H amplifier 1630 with a differential input. An ordinary T/H system may include one transmission-gate where the input signal would be sampled. When the system is in the tracking state, the transmission gate conducts and charges the capacitor. During the hold state, the transmission gate changes to isolation mode and the capacitor holds the charge. However, due to the leakage of the transmission gate in the isolation mode, the charge in the holding capacitor changes which increases the error and reduces the effective number of bits.

In our proposed architecture, apart from the standard transmission gate 1640, a second transmission gate 1650 is added, which is fed with the negative copy of the input signal. This added transmission gate is always in "Off" state or isolation mode. During the hold state, both transmission-gates try to inject charge to the capacitor 1660 due to leakage; however, the charges injected are opposite in sign and cancel each other. This charge canceling mechanism or active cancellation mitigates or eliminates the leakage effect. This combined process can be seen as T/H with active cancellation. Finally, a high input impedance buffer 1670 amplifies the voltage of the holding capacitor 1660 and feeds a 50Ω load.

To operate the transmission switch, clock (clk) and its complementary signal (clk') are needed. A single ended 100 ps rise time external clock is provided which is converted into two complementary clocks with sub-10 ps rise time on-chip. In this process, the clock is divided into two branches with one having an extra NOT gate to generate the complementary signal. Adding an extra NOT gate adds delay in one of the paths. This delay is compensated by making one of the NOT gates with fewer transistors. With fewer transistors, it will take more time to drive the gate capacitance of the preceding NOT gate. Thus, by changing the number of transistors, the delay can be appropriately compensated.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Figure 17:
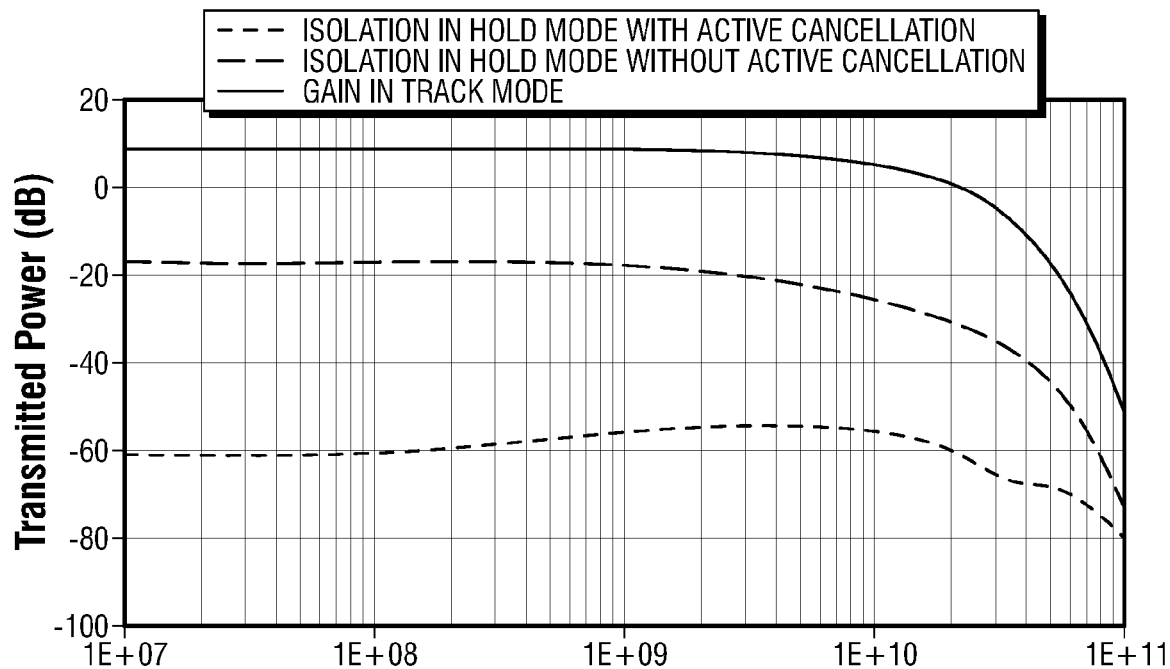
FIG. 17 shows isolation measurements in simulation with and without active cancellation.

Simulation results of Proposed Architecture:

Isolation Measurement in Simulation:

Active Cancellation circuitry increases the isolation during hold mode by mitigating the parasitic leakage of the transmission gate. To measure the effectiveness of the system, the transmitted power through the system is measured in track mode. Then the sampler is switched to hold mode without active cancellation and the transmitted power is measured again. As shown in FIG. 17, which shows gain in track mode, insolation in hold mode with and without active cancellation, the isolation quickly drops as the input frequency increases due to leakage. Next the active cancellation block is activated and the measurement is done again. There is an increase in isolation by more than 30 dB at 10 GHz, which shows the effectives of the active cancellation. Furthermore, the results are validated with experimental measurements.

Measurement Results

Figure 18A:
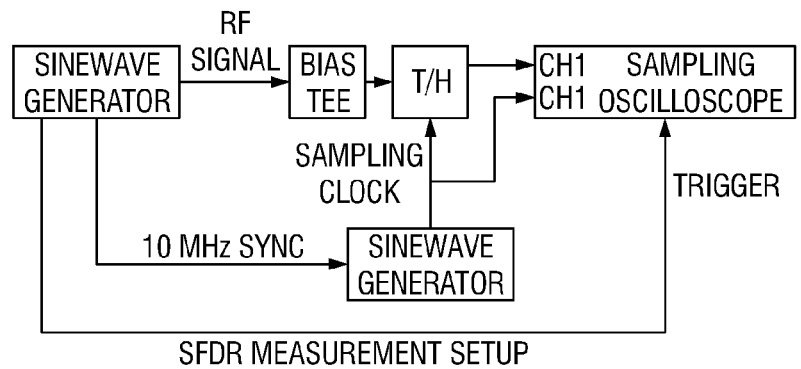
FIG. 18A-18B shows a block diagram of the test setup.
Figure 18B:
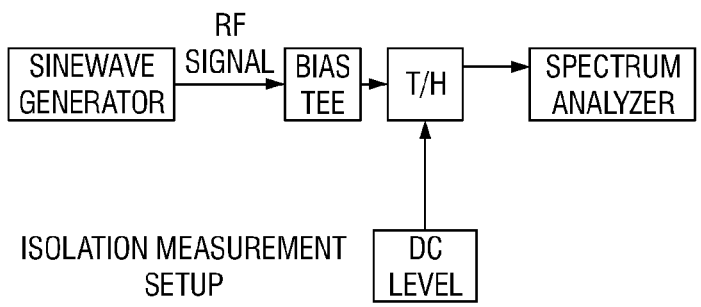

The T/H circuit with active-cancellation is characterized on wafer using 67 GHz RF probes and a two-channel 70 GHz sampling oscilloscope (Agilent DCA-X 86100D). The RF signal generator and the sampling clock are synchronized using a 10 MHz reference signal, as well as an isolation measurement setup are shown in FIGS. 18A-18B.

Figure 19:
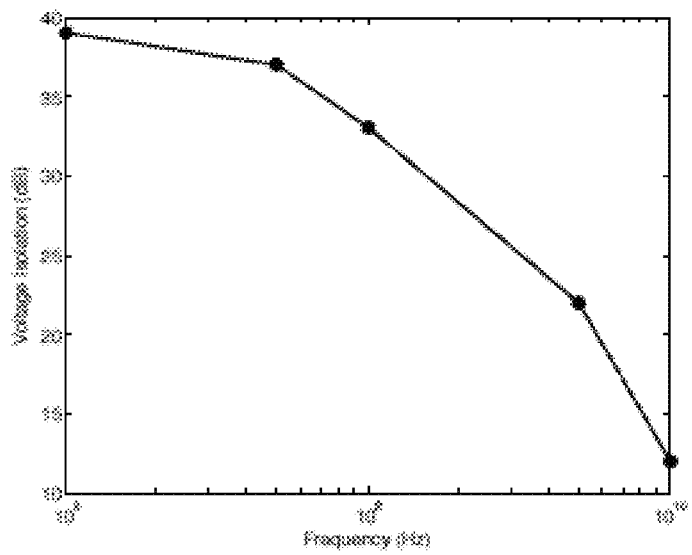
FIG. 19 shows measured isolation by comparing the track and hold modes.

To characterize the performance of the active cancellation block, the isolation of the transmission gate in the hold state should be measured. To measure this isolation, first, the spectrum of the output signal is recoded in the tracking mode. This should characterize the amplifiers and all other blocks in the signal path. Next, the state is changed to the hold mode, and the output spectrum is recorded again. The difference in the results of the first and second experiments is used to calculate the isolation. The input frequency is swept from 100 MHz to 10 GHz and the isolation was measured as shown in FIG. 19. Based on this measurement, an isolation of better than 32 dB is achieved at 1 GHz.

Figure 20A:
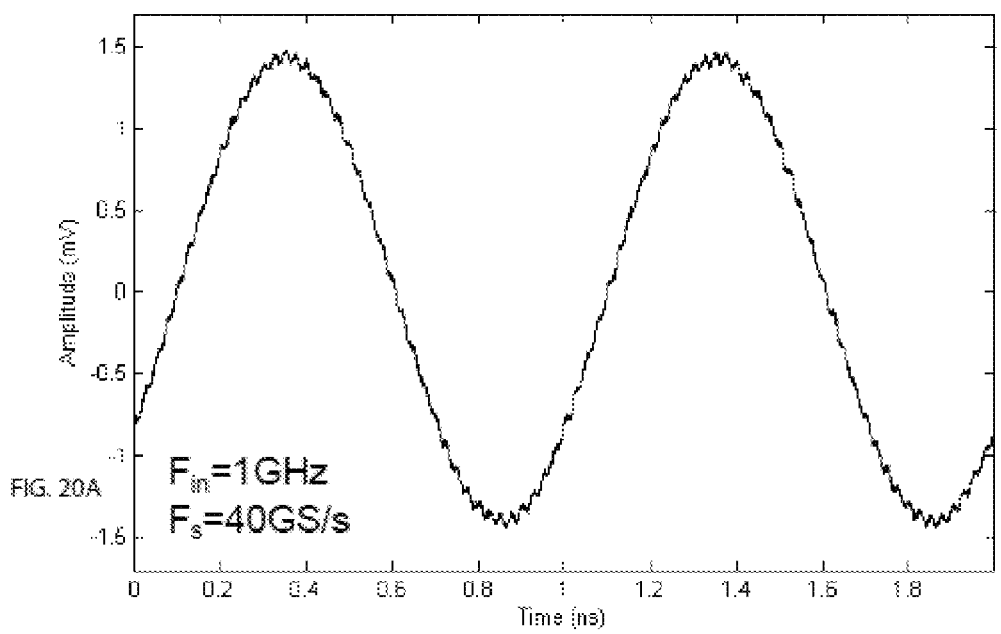

Another measurement to characterize the performance of the sampling block is to find the Spurious-Free Dynamic Range (SFDR). To measure SFDR, an input signal of 1 GHz was sampled at frequencies from 5 GHz to 40 GHz, the range being limited by the RF-signal generator. This measurement was made by calculating 40-point DFT of 1 GHz signal sampled at 40 GS/s over a period of 1 ns, averaged 128 times to attenuate the oscilloscope's sampling head noise as shown in FIGS. 20A-20B. These points were taken in the middle of the hold-state in the sampled waveform with constant repetition rate.

Figure 21A:
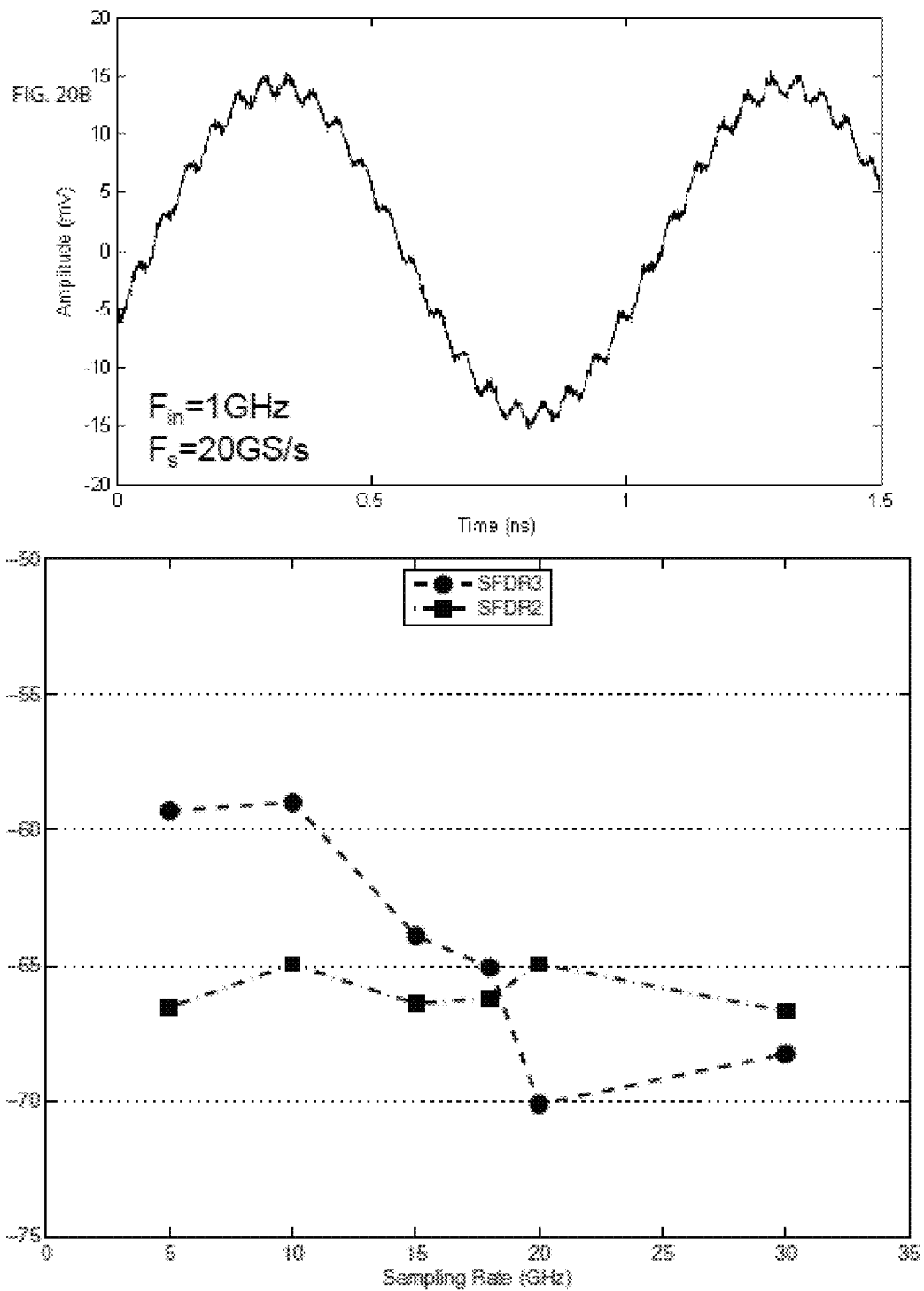

FIGS. 21A and 21B show the $2^{nd}$ and $3^{rd}$ harmonic Spurious-Free Dynamic Range (SFDR2 & SFDR3) for the system over different sampling rates and measured SFDR2 and SFDR3 versus input signal power at sampling frequency 40 GS/s. The hold-state SFDRn denotes the ratio of the fundamental frequency magnitude over $n^{th}$ harmonic spurious magnitude. As evident from FIGS. 21A-21B, 68 dB SFDR3 and 67 dB SFDR2 was observed for 1 GHz signal sampled at 30 GS/s. The results of this chip is compared with the prior art in the table shown in FIG. 22.

Droop Voltage:

Droop voltage refers to the decay of a charged capacitor under the loading of following a stage buffer circuit. Traditionally for high-input frequency samplers, a smaller holding capacitor is used to keep the RC constant small. But in small capacitors voltage can easily change with small charge injection. In samplers without active cancellation, the parasitic leakage injects large amount of charge during the hold mode which considerably changes the voltage of the small capacitor. To reduce this effect, large holding capacitors are used that reduce the overall system performance. With the introduction of active cancellation, the parasitic charge injection is considerably reduced in the hold mode, thus allowing designers to use smaller holding capacitors, which in turn improves the overall performance of the sampler. Experimentally, a droop voltage of 20 μv/ns was observed for a sampled signal of 350 mV. This is equivalent to 10-bit accuracy for a hold time of 10 ns.

Finally, the chip micrograph is shown in FIG. 23. The chip size is 850 um×450 um.

Pulse-Based Communication and Localization:

Pulse-based Secure Communication: Some wireless communication links utilize a transmitter and a receiver whose directivity is predominately defined by the radiation pattern of the antenna. A problem with security in such systems arises due to the wide pattern beam width of the transmitting antennas. Any sensitive receiver, even the ones outside the main lobe of the radiation, can receive and decode the information, making the system spatially insecure. Near Field Directional Modulation (NFDAM) systems modulate the signal at the antenna-level to make the information beamwidth narrow and directional, without narrowing the radiation pattern. NFDAM (or directional modulation) transmitters scramble the signal constellation points outside the main information beamwidth, thus preventing even a sensitive receiver from decoding the signal outside the information beamwidth. Most directional modulation systems are focused on narrow-band continuous-wave transmitters.

As discussed further herein, a broadband time-domain pulse-based directional antenna modulation architecture is introduced that can substantially increase the security of the wireless communication. Multiple widely spaced transmitting antennas are synchronized at the symbol level to generate a very narrow (~1°) information beamwidth. In some embodiments, this pulse-based directional architecture may be combined with the active cancellation system discussed previously. For example, a receiver of this architecture may include the features of an active cancellation system. However, it will be recognized by one of ordinary skill in the art, other embodiments of this pulse-based directional architecture may be implemented independently of an active cancellation system.

Amplitude Modulation (AM) may be used to establish communication using short pulses. In contrast to conventional wireless communication systems, where the complete constellation symbol is transmitted from one antenna (in case of phased array, from all antennas), the pulse-based communication systems and methods discussed herein fundamentally differs in the topology. Instead of sending the complete constellation symbol (complete information) from a single antenna, a part of the symbol (semi-symbol), which is a fraction of the total amplitude, is sent from one antenna and the remaining fraction is sent from other antennas. The transmitting antennas are synchronized at the symbol level. A receiver placed exactly at the point where all the semi-symbols arrive at the same time, sees the correct complete symbol. The point where all the semi-symbols combine coherently is unique in space, and being so, the communication can be said to be spatially encrypted.

Figure 24:
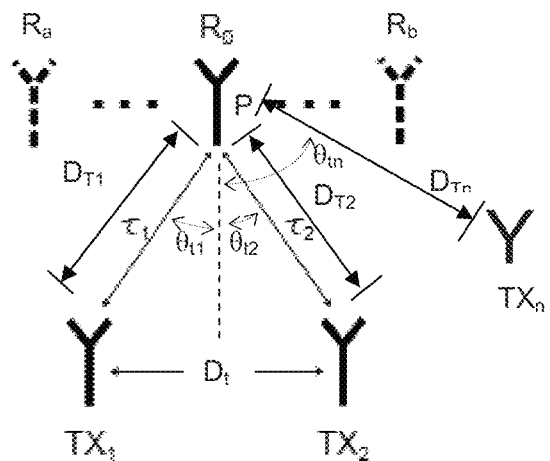
FIG. 24 is an illustrative embodiment of a pulse-based system.
Figures 25A, 25B, 25C, 25D:
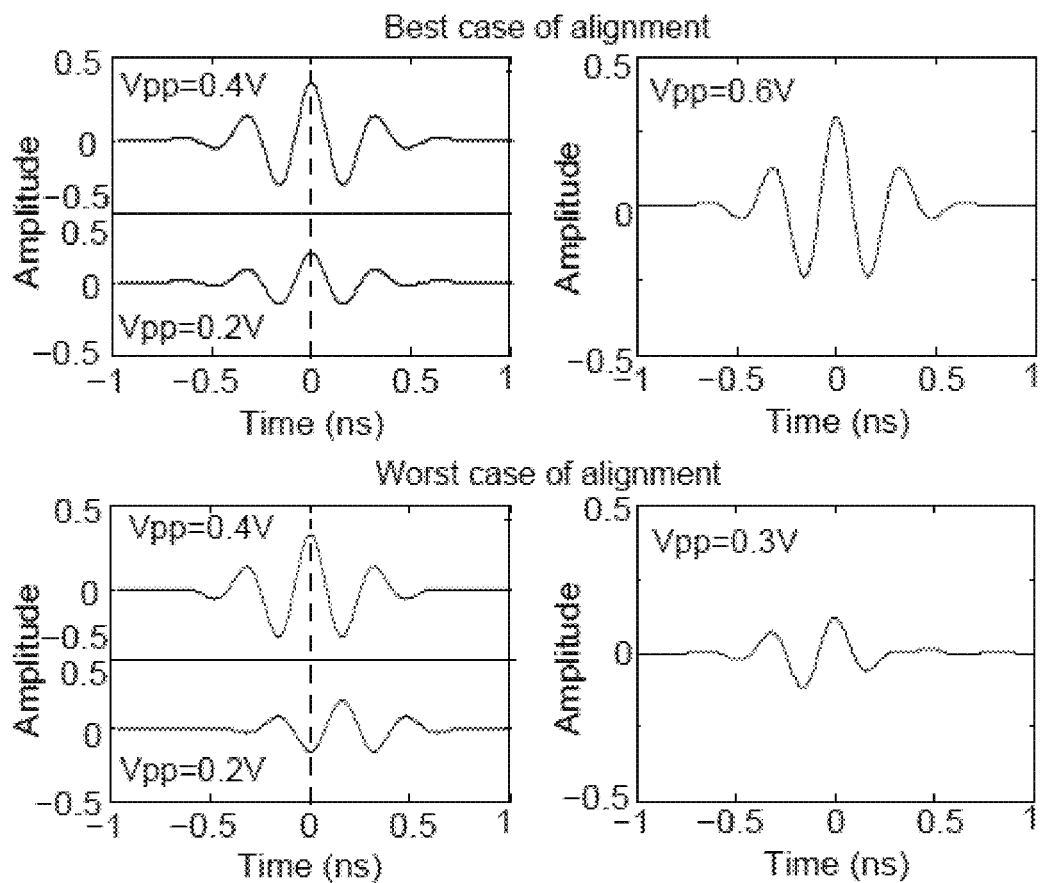
FIGS. 25A-25H show transmitted semi-symbols and received symbols in best case and worst case alignments.
Figures 25E, 25F, 25G, 25H:
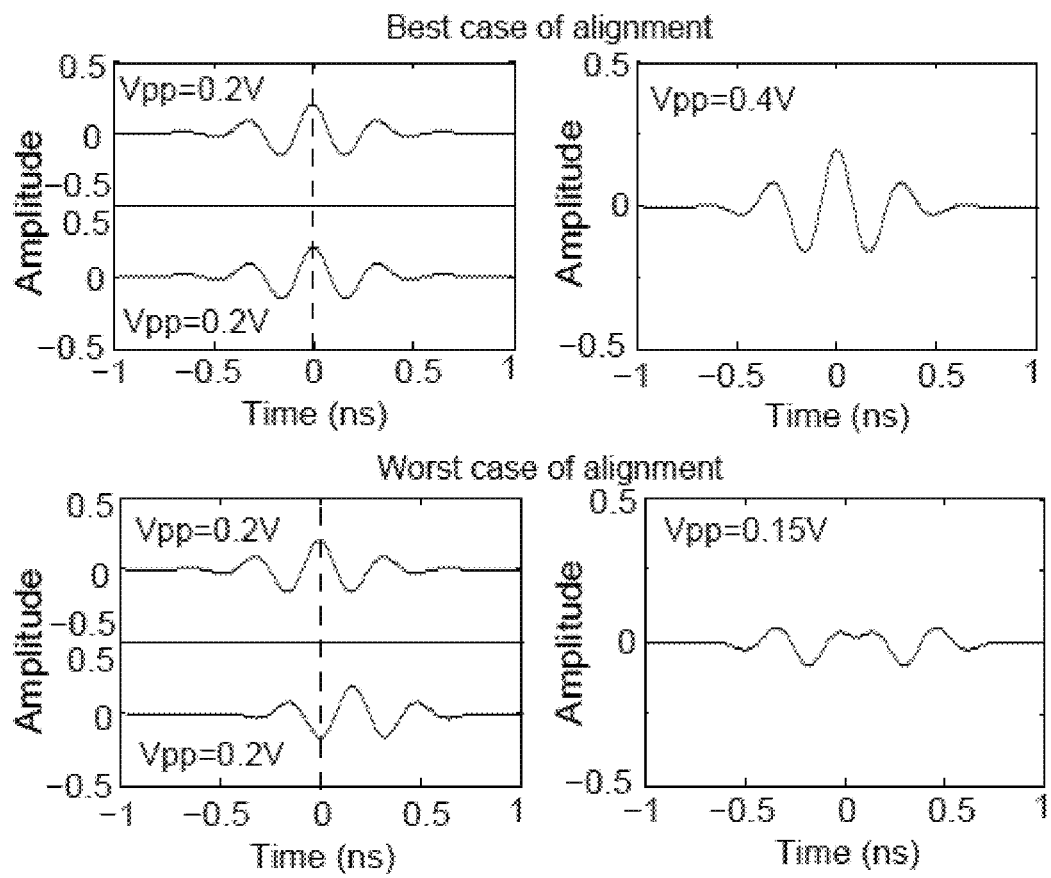

The pulse-based system is explained with two transmitters as shown in FIG. 24. Let $S_{orig}(t)$ be the signal which corresponds to a complete symbol. This signal is divided into two or more overlapping semi-symbols. For purposes of nonlimiting illustration, there may be two overlapping semi-symbols, $S_1(t)$ and $S_2(t)$ such that $S_{orig}(t)=S_1(t)+S_2(t)$. These two signals $S_1(t)$ and $S_2(t)$ are generated at $Tx_1$ and $Tx_2$, respectively, using two synchronized base-band waveform generators. Assuming there is a separation distance of between $Tx_1$ and $Tx_2$ ($D_t$), the signal received at different angles in space will be $S_1(t-\tau_1)+S_2(t-\tau_2)$, where $\tau_1$ and $\tau_2$ are the propagation delays from $Tx_1$ and $Tx_2$ to a point P in space, respectively Point P represents a desired point at which a desired combined symbol or signal corresponding to $S_{orig}(t)$ is to be received by a desired receiver $R_0$. Points other than the desired point P receive distorted or erroneous signals that do not properly correspond to $S_{orig}(t)$. For example, receivers away from the desired point P (e.g. $R_a$ and $R_b$) receive distorted signals because the semi-symbols from the transmitters do not arrive at expected times for proper combination.

In some embodiments, the desired point P may be defined in any suitable manner that identifies the position of point P (or a desired receiver $R_0$) relative to two or more transmitters ($T_{x1}, T_{x2}, T_{xn}$). In some embodiments, the positions of point P, transmitters $T_{x1}, T_{x2}, T_n$, and receiver $R_0$ may be defined utilizing an XYZ coordinates. In other embodiments, the position of components may be defined relative to other components. For example, a desired separation distance between two transmitters $D_t$, the separation distance between the first transmitter $D_{T1}$ and receiver, the separation distance between the second transmitter and receiver $D_{T2}$, and angle information may be utilized. In embodiments with more than two transmitters, information on the separation distance between the first and further transmitters $D_{T1-Tn}$, and the separation distance between the $N^{th}$ transmitter and the receiver $D_{Tn}$ may be desirable to determine the desired point P. The angle between zero axis for point P and a specific transmitter may be referenced as $\theta_{T1}, \theta_{T2}, \theta_{Tn}$. If a receiver $R_0$ at point P is located equidistance from $Tx_1$ and $Tx_2$, both the signals will reach at the same time and will overlap/coincide with each other, thus generating the desired signal/symbol. However, if $\tau_1 \neq \tau_2$, the received signal will be $S_1(t-\tau_1)+S_2(t-\tau_2)$ which is distorted and non-overlapping.

It should be noted that a receiver of the desired overlapping signals is shown as being equidistant for illustrative purposes, but as discussed further below, it is possible to locate a receiver for receiving the desired signals at a non-equidistant position by properly accounting for propagation delays.

Illustrative Example:

For the sake of simplicity and without losing any generality, two transmitters ($Tx_1$ and $Tx_2$) and one receiver (Rx) are chosen. The two transmitters are synchronized time-domain short pulse generators with amplitude modulation capability. The transmitters have 10 steps of amplitude modulation (e.g. 0.1, 0.2 . . . 0.9, 1.0). For simplicity, only the first 2 bits (4 levels) of modulation are used (from 0.1-0.4). Thus, each transmitter can transmit 2 bit amplitude-modulated synchronized Gaussian pulses (semi-symbols). The received signal for an equidistant receiver will be the sum of the transmitted signals (semi-symbols) whose amplitude corresponds to a certain bit value.

From here on, bit values are assigned to corresponding received amplitudes. For instance, a received signal with peak to peak voltage of 0.3V will be referred to as bit '00', 0.4 v as bit '01' and so on and so forth, as shown in FIGS. 25A-25H.

For instance, if $Tx_1$ transmits semi-symbol $X_1$ and $Tx_2$ transmits semi-symbol $X_2$, the received signal will be the sum of transmitted signals, $X_1+X_2$. For the sake of simplicity, it shall be assumed that the two transmitters are to transmit simultaneously to avoid the need to compensate for propagation delays. However, as noted previously, other embodiments may compensate for propagation delays, thereby avoiding the need for the receiver to be equidistant from the two transmitters. For two different transmitted semi-symbols, the received symbol will be the same as long as their sum is constant and the receiver is equidistant from both the transmitters. However, in the case the when the receiver is not equidistant, there will be no or partial overlapping of the semi-symbols, which will distort the received symbol. This distorted symbol will have a different peak-to-peak amplitude than the sum of two semi-symbols. This incorrect amplitude will correspond to a different bit, and thus be read erroneously by the eavesdropper. Moreover, with the possibilities of assigning different semi-symbols for the same transmitted symbol (e.g. for $X_1+X_2=0.3V$, either $X_1=0.1V$ and $X_2=0.2V$, or $X_1=0.2V$ and $X_2=0.1V$), the statistical symbol recovery for the eavesdropper becomes even more difficult. This could be further understood from FIGS. 25A-25H, which shows transmitted and received signals for different alignments.

Table 1 below tabulates all the possible combinations of transmitted and received symbols for an equidistant receiver antenna.

TABLE 1

Transmission Table for Transmitter

| Tx1 (Semi-symbol) | 0.1 | 0.1 | 0.2 | 0.1 | 0.2 | 0.3 | 0.1 | 0.2 | 0.3 | 0.4 | 0.2 | 0.3 | 0.4 |
|---|---|---|---|---|---|---|---|---|---|---|---|---|---|
| Tx2 (Semi-symbol) | 0.1 | 0.2 | 0.1 | 0.3 | 0.2 | 0.1 | 0.4 | 0.3 | 0.2 | 0.1 | 0.4 | 0.3 | 0.2 |
| Tx1 + Tx2 (Complete-symbol) [Bits] | 0.2 | 0.3 [00] | | 0.4 [01] | | | 0.5 [10] | | | | 0.6 [11] | | |

Division Algorithm:

The semi-symbols for each transmitter are generated based on the final symbol to be sent. For instance, if bit "10" is to be sent, the transmitters randomly choose one of the 4 possible semi-symbol combination as shown in Table 1.

Receiver Decoding Algorithm:

The receiver is in the line-of-sight (LOS) with the transmitters. It uses the amplitude of the combined signals to detect different symbols. A look-up table is used to convert the detected amplitude to bits.

Beam Steering Capability:

Even though the results are discussed for an equidistant receiver, the desired focus point of the system can be changed by introducing proper relative delays in the transmitters. These delays will determine the point in space where the semi-symbol combines correctly, which provides the lowest Bit Error Rate during communication. Thus, one of the advantages of this topology is the convenience of changing the direction of information beam by introducing relative delays in the transmitters.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Figure 26:
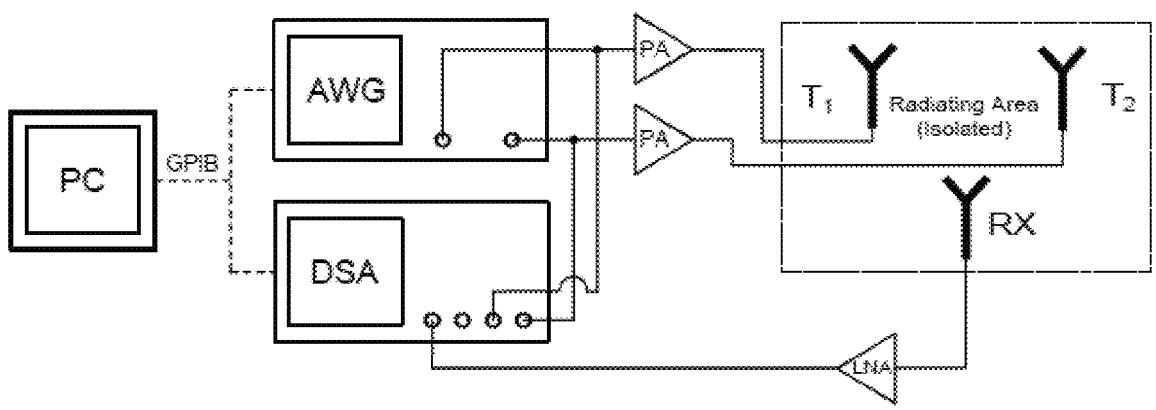
FIG. 26 shows an experimental setup for a pulse-based system.

Experimental Setup:

The experimental setup comprises an arbitrary waveform generator, which generates two streams of synchronized pulses. These pulses are amplified and transmitted using impulse antennas designed to operate in the 3-10 GHz band. A similar impulse antenna is used as a receiver. The received signal is amplified by an LNA before being sampled by a 25 GS/s real time oscilloscope. The two transmitters are placed at a separation distance of 0.6 m, and the receiver antenna is placed at a distance of 1.2 m from a line connecting the two transmitters as shown in FIGS. 26 (block diagram) and 29 (photo). The cable length is carefully calibrated, so that the pulses reach the transmitting antennas at the same time. The whole setup is automated using a Matlab code. In this setup, a master computer communicates with the instruments using GPIB-VISA protocol.

Setup Calibration & Table Generation:

The system was calibrated before preforming the Bit Error (BER) test. The system was calibrated by each transmitter sending all possible bits. Based on the received signal, the gain of the amplifier is recorded. The non-linearity in the gain of the amplifier is compensated by pre-distorting the input signal.

Figure 27:
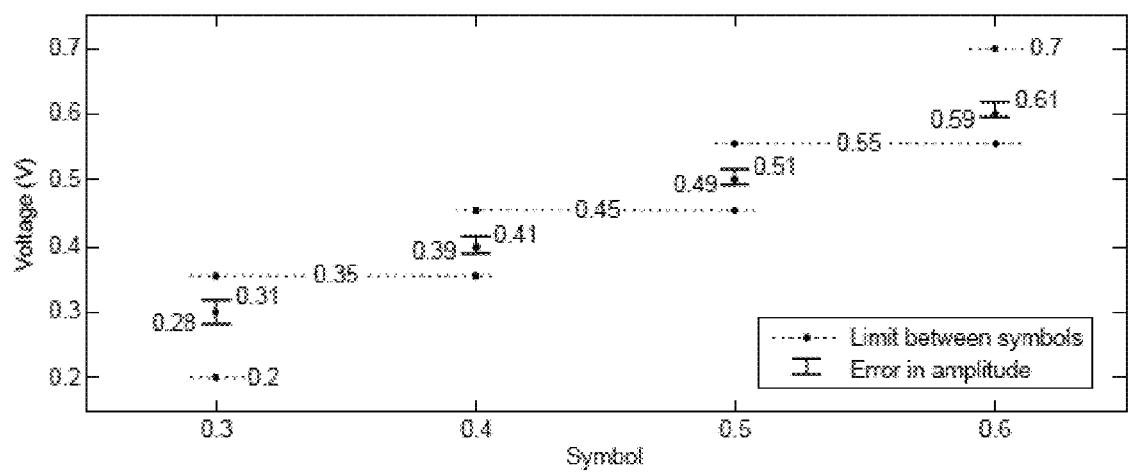
FIG. 27 shows bit error (BER) results.

A look-up table is generated by sending random bits and recording the maximum and minimum voltage levels for each symbol. For instance, the symbol corresponding to bit "00" (0.3 volts) is transmitted with all possible semi-symbol combinations. Even after performing the predistortion, for a desired symbol value of 0.3V, the receiver may receive a value between 0.28V to 0.31V, which is due to the non-linearity in the system. This level of error in the proposed architecture can be tolerated. The small deviation of received signal voltage over the original signal makes the system more robust and allows for improved BER performance. Finally, the thresholds are set midway between the symbol voltages and corresponding bits are assigned, as shown in FIG. 27.

Results:

To measure BER, a pseudo-random number generator is used to generate the transmitted bits. These bits are decomposed into symbols and symbols are then broken down into multiple pair of semi-symbols. All these pairs of semi-symbols will generate the same complete symbol at desired direction of transmission. A random generator picks one of these pairs and assigns it to two transmitting antennas. This random selection of semi-symbol pair increases the complexity for the eavesdropper to perform a statistical recovery. The received signal is then compared against the look-up table introduced earlier. Finally, the BER is calculated by comparing the received bits with the transmitted bits.

Figure 28:
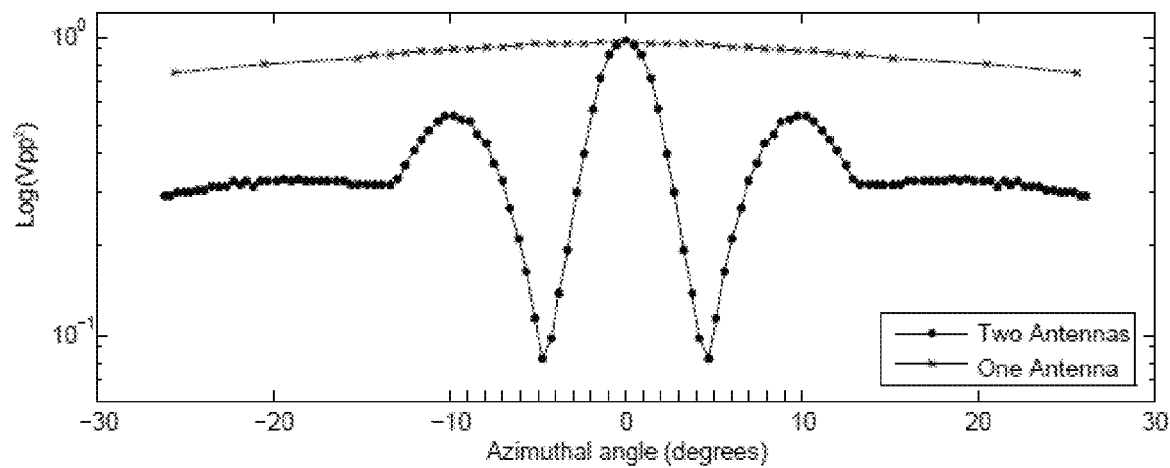
FIG. 28 shows effective radiation patterns of one antenna and two antennas.
Figure 29:
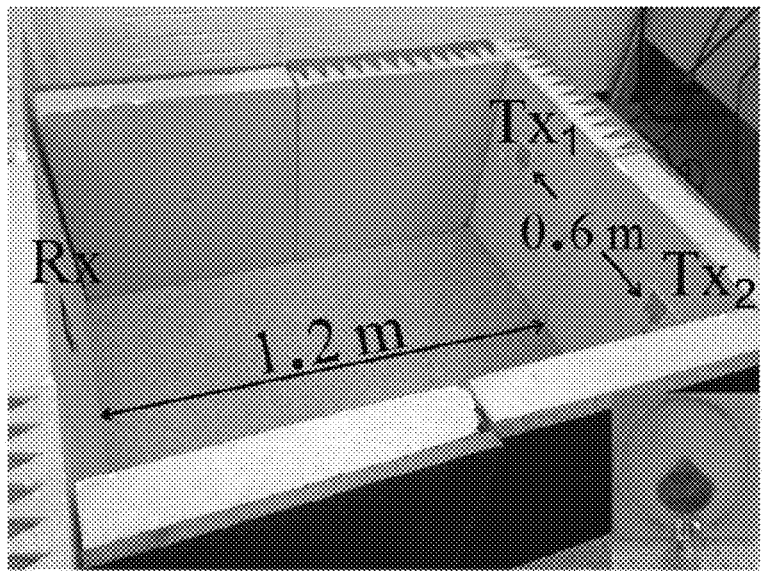
FIG. 29 shows a photograph of the experimental setup.

Time Domain Radiation Pattern of One vs Two Antennas:

The radiation pattern of a single impulse antenna is derived by measuring the power of the radiated pulse as a function of angle, as shown in the FIG. 28. As expected, the radiation pattern of the single antenna is very broad. The power of the received pulse from two separate synchronized transmitting antennas as a function of angle is also shown. At the center, both the pulses overlap constructively resulting in higher amplitude. However, as the receiver moves away from the center, two pulses arrive at different times. The received pulse amplitude reaches a minima when the maxima of one transmitted pulse overlaps with the minima of another. This first occurs when the differential delay between the pulses is half the pulse width. Thus, by changing the pulse width, it is possible to change the location of the first null point.

Symbol Collapsing:

As the receiver moves away from the center, one of the transmitted signals adds more delay. This differential delay causes partial symbol overlap. This partial overlap combined with the possibility of sending multiple semi-symbols for the same complete symbol results in a range of received amplitudes that overlaps with the amplitude of the other symbols (FIGS. 25A-25H). This phenomenon results in higher BER for the receivers that are not located at the desired angle. The angular range between the two null points in FIG. 28 creates a void zone, near and beyond which, the symbols cannot be distinguished and so, the communication link cannot be established. Moreover, by reducing the pulse width, the void zone becomes smaller, resulting in a smaller information beam-width.

Figure 30A:
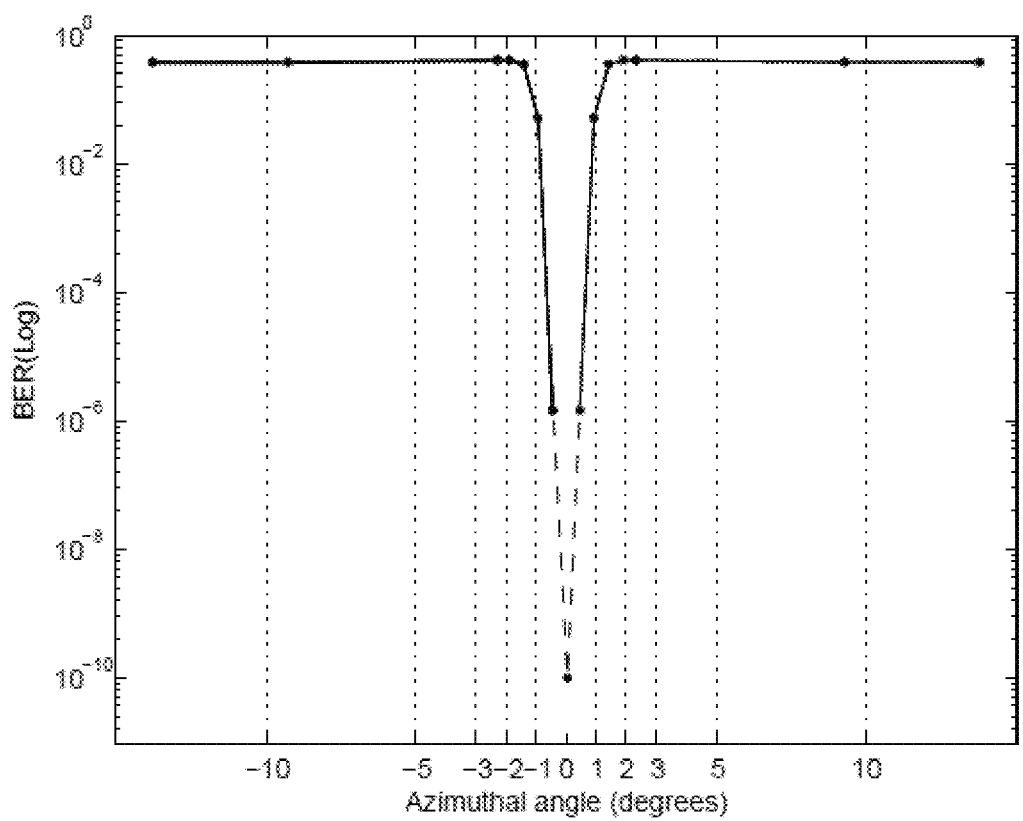
FIGS. 30A-30B show the BER of two synchronized pulse-transmitting antennas.
Figure 30B:
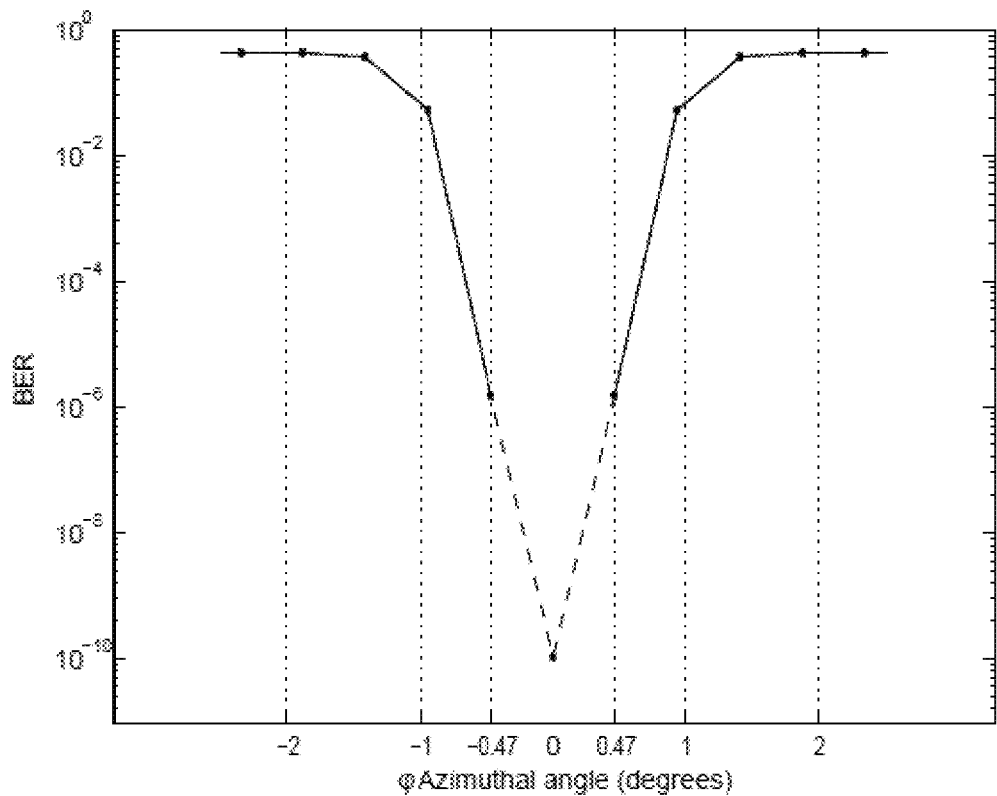

Radiation Pattern vs Information Pattern:

Information pattern is used to represent the spatial information distribution of a communication system. FIG. 30A-30B shows the BER of two synchronized pulse-transmitting antennas. In this experiment, a BER of $10^{-2}$ at 1° and $10^{-6}$ at 0.47° was recorded. A linear extrapolation of these results gives a BER of less than $10^{-10}$ at the center.

An important observation to make is that the BER increases rapidly as the receiver moves away from the center. This phenomenon is caused due to symbol collapsing. In addition to this, reduction in pulse width brings the null points in FIG. 28 closer to the center and symbol collapsing happens at a smaller angle. This effect enhances the security of the wireless link by making the BER well even sharper.

Pulse-Based Localization & Imaging:

The ability to localize and image objects has always intrigued the scientific community. Such technology has proven to be of significance importance in the field of security, air-traffic control, car anti-collision systems and more. RADAR systems rely on the echo of a continuous RF signal to determine the location and even the shape of the reflecting object. This approach has served the military and consumers for the past few decades. A novel technique for improving the accuracy of localization and the resolution of imaging radars may utilize a time-domain pulse-based directional modulation.

In some embodiments, this pulse-based localization and imaging system may be combined with the active cancellation system discussed previously. For example, a receiver of this architecture may include the features of an active cancellation system. However, it will be recognized by one of ordinary skill in the art, other embodiments of this pulse-based localization and imaging system may be implemented independently of an active cancellation system.

Figure 31:
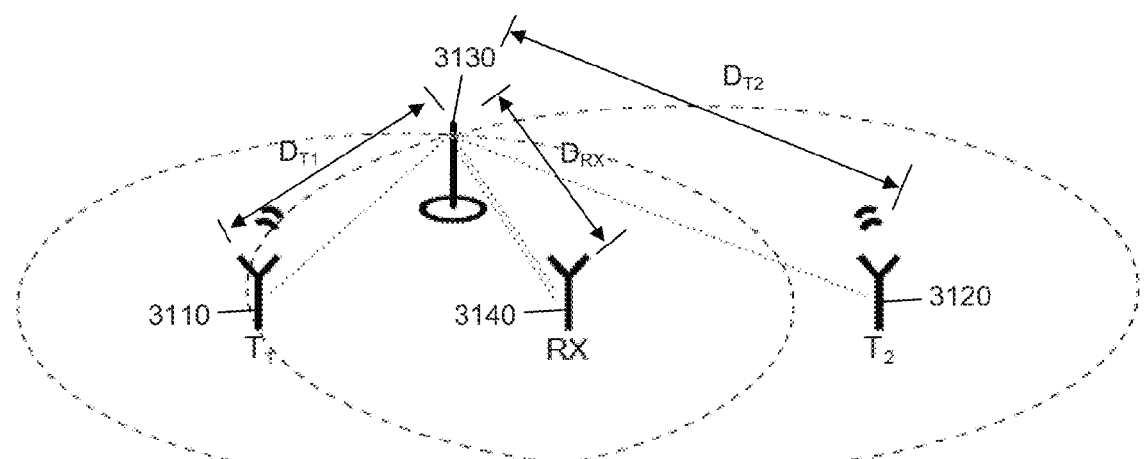
FIG. 31 is an illustrative embodiment of a pulse-based imaging system.
Figure 34:
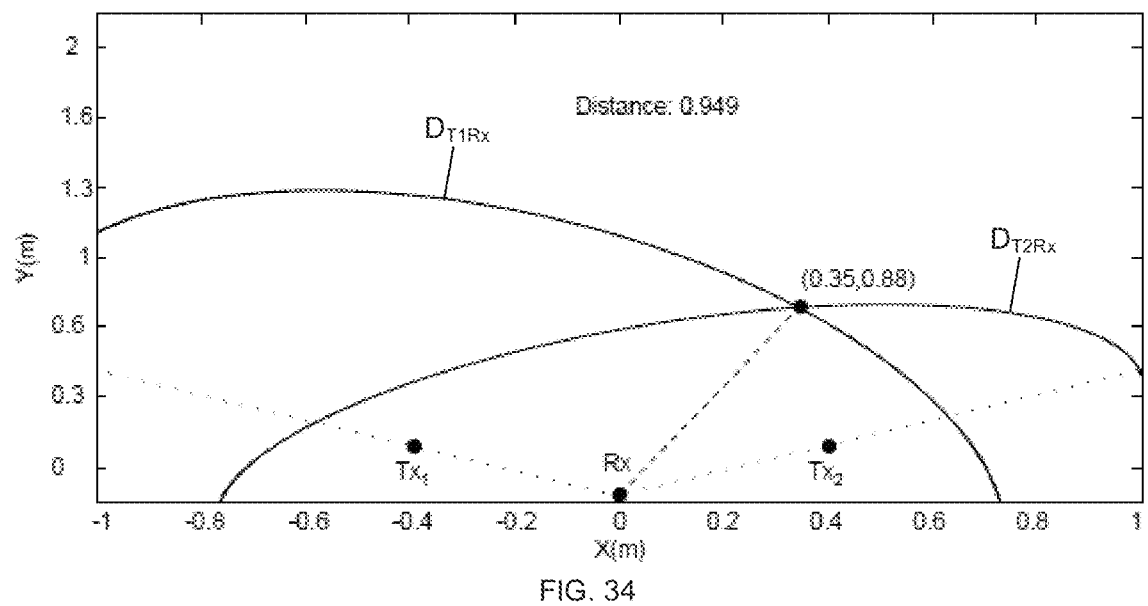
FIG. 34 shows triangulation of a received signal.

Pulse-Based Localization and Imaging System:

An illustrative embodiment of a pulse-based localization and imaging system is shown in FIG. 31. In the proposed technique, a train of narrow time-domain pulses is used for localization and imaging. These pulses are generated, amplified and transmitted using impulse antennas 3110 and 3120. The radiated pulses get reflected from an object 3130 and are collected at the receiver 3140, which may be coupled to a processor (not shown) for performing desired calculations. By calculating the time of flight (i.e. the time taken by the pulse to travel to the object, get reflected and to be received by the receiver), a total travel path distance (e.g. $D_{T1}+D_{RX}$ or $D_{T2}+D_{RX}$) can be calculated that is utilized to plot an ellipse. A locus of points whose total distance or the calculated total travel path distance from two points (e.g. $T_1$ & RX or $T_2$ & RX) is constant, and this total distance can be utilized to form an ellipse that represents potential positions of the object. Thus, a certain time of flight corresponds to a particular travel path distance. In order to triangulate the exact position of the object, more than one such ellipses of total distance are required. With the known distance between the transmitters and the receiver, the position of the transmitters can be plotted as shown in FIG. 34. Further, desired ellipse(s) of total distance (e.g. $D_{T1RX}$ and $D_{T2RX}$) can be drawn on which the object lies. Multiple transceiver pairs can be used to form multiple ellipses to triangulate the exact location of object(s). As with the pulse-based communication system shown in FIG. 24, this pulse-based localization and imaging system may define the position of components of the system with XYZ coordinates or by defining position of the components relative to each other.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Figure 32:
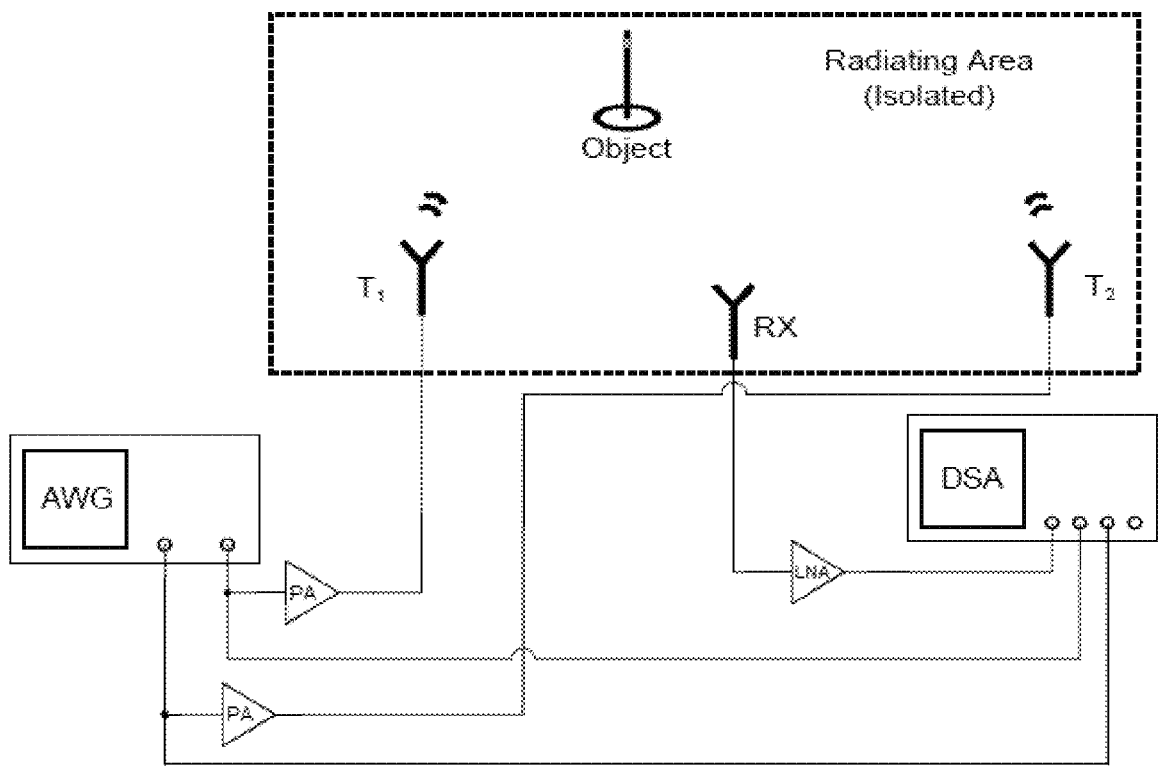
FIG. 32 shows a block diagram of an experimental setup for a pulse-based imaging system.

Experimental Setup:

The block diagram of the experimental setup is shown in FIG. 32. A two-channel arbitrary waveform generator (Tektronix AWG7122C) is connected to the power amplifiers, each with 25 dB gain to generate the transmitted pulses. These generated signals are radiated using impulse antennas. A similar impulse antenna is used as a receiver whose signal is amplified by a 30 dB gain LNA before being sampled by an oscilloscope. A copy of the original transmitted pulse signal is also recorded by the oscilloscope to determine the time of flight. Care has been taken to make sure the lengths of the cable are equal, as the setup is sensitive to timing mismatch.

The distance between the transmitters is 940 mm and the receiver is placed in the middle, but 150 mm behind the transmitters to reduce the direct coupling between the transmitters and the receiver.

The object to be localized is an acrylic rod which is 12.5 mm in diameter. Since acrylic has a very weak RF signature, to make the object more reflective, a small stripe of aluminum foil, 10 mm in height, is wrapped around the rod in a way such that the middle of the stripe is at the same height as the center of the antennas. All acquisitions are automated using MATLAB-toolbox and GPIB-VISA protocol.

Figure 33:
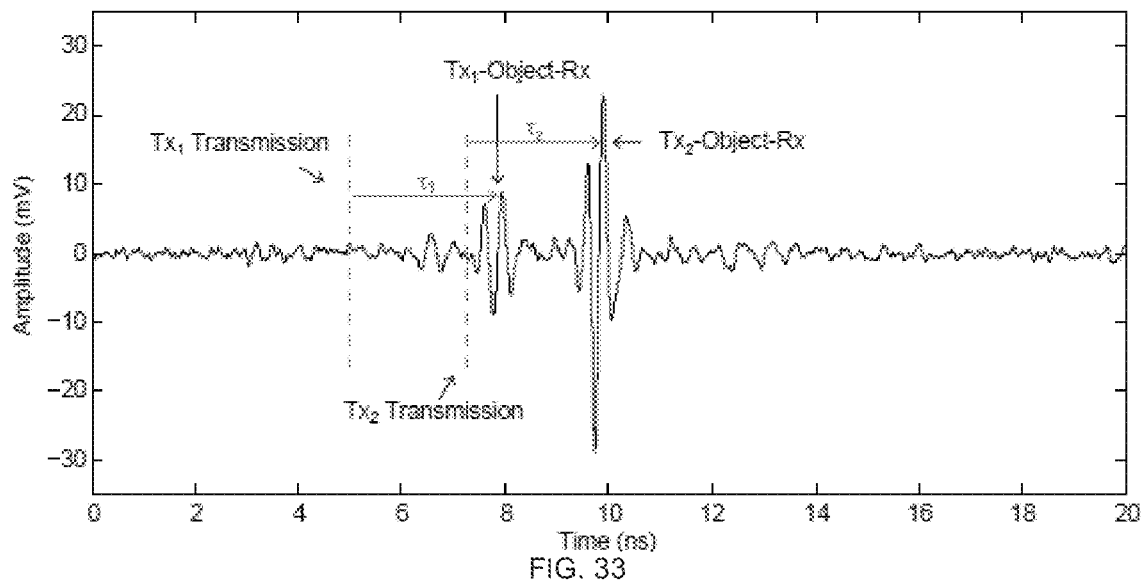
FIG. 33 shows a received signal after reflection.

Working Explained:

The reflected Gaussian pulse which was radiated using the impulse antenna is recorded by an oscilloscope. A separate channel is used to digitize the copy of the transmitted signal. The recorded signals are downloaded from the oscilloscope to a computer over GPIB, where Matlab finds the peak in the reflected and transmitted signals to compute the time of flight. This time of flight information is then multiplied by the speed of light to give the round trip distance between the transmitter, object, and the receiver. Knowing the distance between the transmitter and the receiver, the desired ellipse can be drawn, on which the object lies. Multiple transceiver pairs can be used to form multiple ellipses to triangulate the exact location of object(s). FIG. 33 shows the reflected signal and the time delay caused by longer travel path. FIG. 34 shows the intersection of the ellipses to triangulate the location of the object. A first ellipse represents a locus of points whose total distance $(D_{T1Rx})$ is the distance from the first transmitter $(T_1)$ to the object and from the object to the receiver (RX). A second ellipse represents a locus of points whose total distance ($D_{T2Rx}$) is the distance from the second transmitter ($T_2$) to the object and from the object to the receiver (RX). The location of the object may be triangulated by determining the intersection point of the first and second ellipses.

Figure 35:
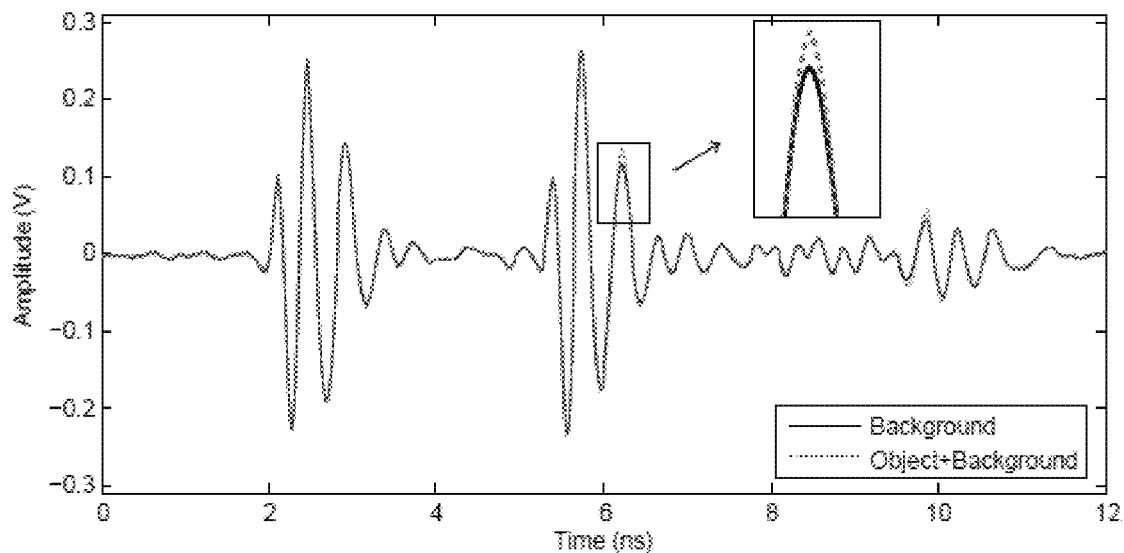
FIG. 35 shows a received signal with and without an object.
Figure 36:
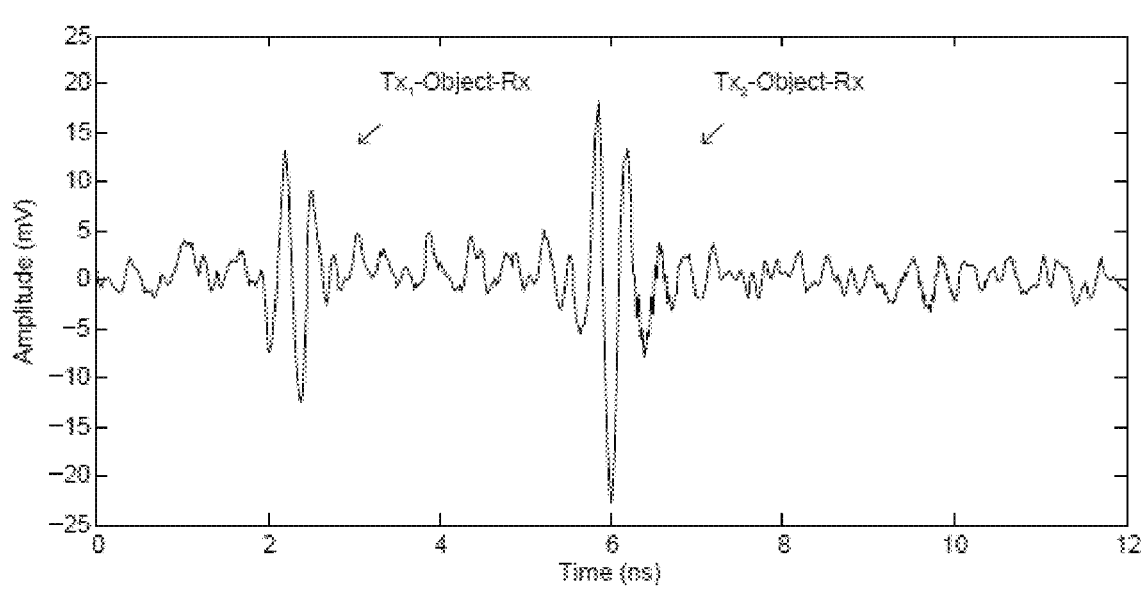
FIG. 36 shows a received signal after subtracting a background signature.

Experiment Calibration:

The setup was calibrated using a two stage calibration process as the experiments are extremely time and distance sensitive. During stage one, the cable lengths were adjusted in such a way that both the transmitted signals reach the antennas at the same time. Also, the delay in signal path from transmitter to antenna and antenna to receiver was carefully measured. This data was later used in distance estimation. In stage two, ultra-shot pulses (~160 ps peak to peak) are radiated using the impulse antennas. The object is removed from the scene (imaging arena) and the reflected signal is recorded. This captured time domain signal contains data about the background and its reflection signature. This signature is later subtracted from the reflected signal of the scene with the object present to increase the SNR of the system. FIG. 35 shows the reflected signal with and without the object. FIG. 36 shows the change in reflection signature due to the presence of the object by subtracting the reflected signal with object from one without.

EXPERIMENTAL RESULTS

Figures 37A, 37B:
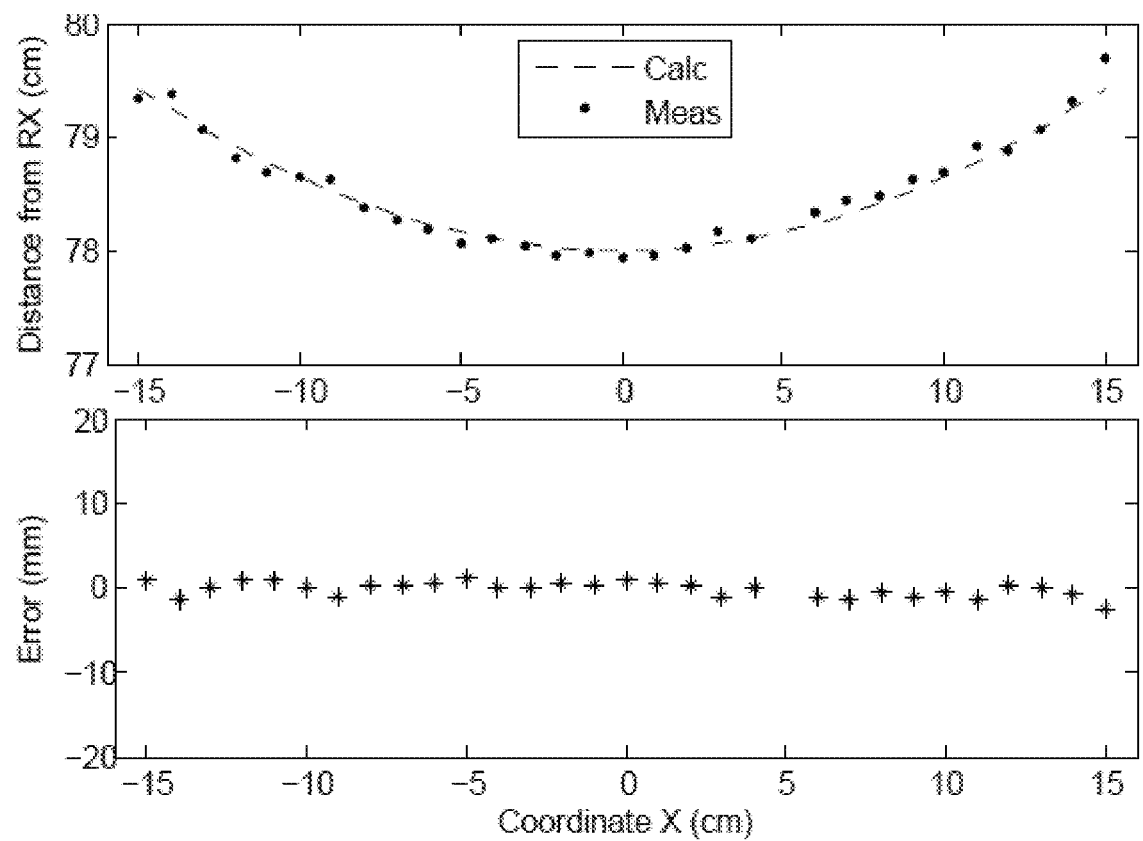
FIGS. 37A-37B show measured and calculated distances and error rates.
Figure 38A:
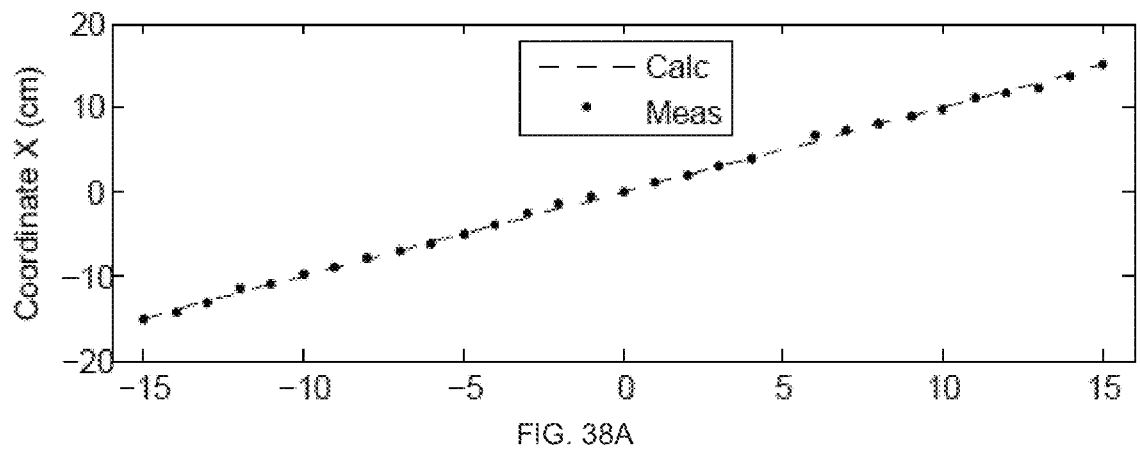
FIGS. 38A-38B show calculated X and Y coordinates of an object.
Figure 38B:
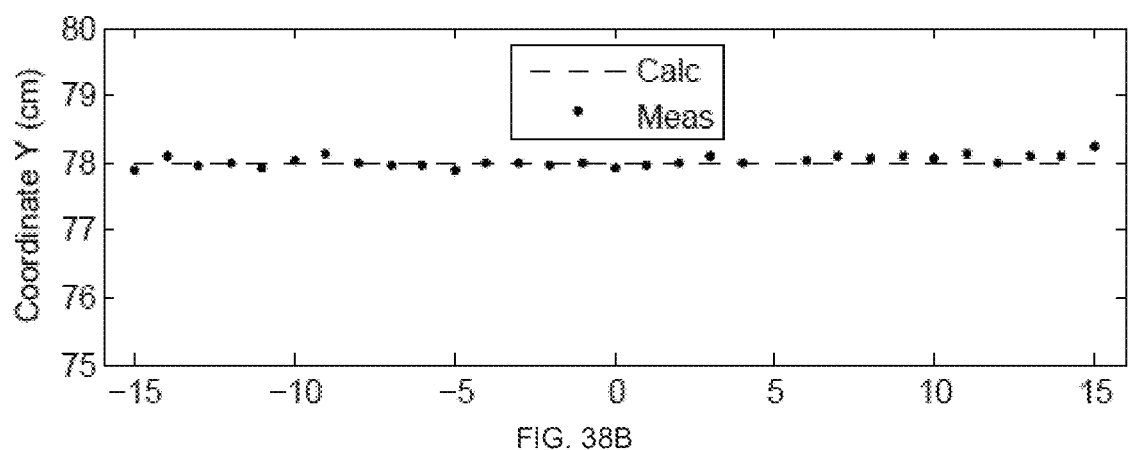

Single Object Localization:

To validate the proposed architecture, various experiments were preformed to accurately determine the location/position of the object. This was done by placing an object on a one-dimensional travel table, which can travel 300 mm with an accuracy of 0.01 mm. The rail was in alignment with the receiver antenna such that the object moves from 150 mm left of the receiver to 150 mm right of the receiver with steps of 10 mm, at a fixed perpendicular distance of 780 mm from the receiver antenna. Such an orientation was chosen because even though the object was moving in one-dimension, the total round trip distance changes parabolically, thus emulating two-dimensional motion. The dashed curve in FIGS. 37A-37B is the exact distance of the object from the receiver during the sweep. The dots represent the measured distance using the proposed technique. It can be seen that the divergence of measured distance over the actual distance is extremely small and that the variance is of the order of few millimeters. Furthermore, from this time domain data, triangulation ellipses are drawn to calculate the absolute coordinates of the object. Shown in FIGS. 38-38B are the exact and calculated X,Y co-ordinates of the object. Since the object is moving in X-direction, the X co-ordinates increases linearly while the Y coordinates stays the same.

Multiple Object Localization:

Multiple object imaging can be viewed as imaging discrete points. This assumption is valid if the objects are at a considerable distance from each other and do not obscure the RF signal. If such a pattern is followed, multiple ellipses can be drawn to triangulate the position of each point object. However, the above assumption is not always true and then, imaging such a cluster is not trivial.

Advantages of Pulse-Based Systems over Continuous Wave System:

One of the major advantages of pulse-based systems over continuous wave systems is the ability to mitigated multi-path effects. In case of pulse based systems, the multi-path reflections will arrive at a different time, later than the one directly reflected from the object. Thus, it is easier to eliminate such multi-path reflected signals in time-domain based systems by discarding the signal that comes at later time. However, in case of continuous wave systems, the multi-path reflected signals interact with the line-of-sight reflected signal and changes the phase of the received signal, which is difficult mitigate.

Novelty and Potential Applications:

The proposed pulse-based communication system adds an extra level of security at symbol level. This makes it extremely difficult for an eavesdropper outside the information beam-width to unscramble the transmitted symbols. Such secure communication schemes are extremely useful in point to point, directional, high-data rate transmission channels. This scheme can be of significant importance in base-station to base-station links or in establishing secure communication between two bases, such as military bases.

The RF-radar imaging has already shown its significance in automotive driving assistance and deep penetration imaging for aviation. With the proposed imaging technique, a pulse-based high-resolution radar systems that is less severely affected by multi-path effect and can attain higher resolution due to smaller wavelength is provided.

CONCLUSION

An ultra-wideband pulse-based directional modulation technique is introduced for secure communication and localization. An information beamwidth of 1° is achieved using antennas with a broad radiation pattern. Moreover, localization with millimeter accuracy is demonstrated using sub-200 ps pulses.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A method for active cancellation for an analog to digital converter (ADC), the method comprising:
   receiving an input signal by the ADC and generating a differential pair, wherein the differential pair comprises the input signal and a negative signal, which is a negative copy of the input signal;
   providing the input signal to a first transmission gate, wherein the first transmission gate is capable of switching between on and off states;
   providing the negative signal to a second transmission gate, wherein the second transmission gate remains in the off state; and
   combining output signals from the first and second transmission gates, wherein the output signals of the first and second transmission gates cancel out when both the first and second transmission gates are in the off state to mitigate a leakage effect.

2. The method of claim 1, wherein the negative signal is generated with a differential amplifier.

3. The method of claim 1, further comprising the step of signal conditioning the differential pair to reduces a phase and amplitude imbalance of the differential pair.

4. The method of claim 3, wherein the signal conditioning step provides one or more stages of differential amplifiers and a voltage follower.

5. The method of claim 1, wherein the ADC is operable at input frequencies of 1 GHz or greater.

6. The method of claim 1, wherein the ADC is capable of providing sampling windows of 10 picoseconds or less.

7. The method of claim 1, further comprising the step of sampling combined outputs when the first transmission gate is switched to the off state.

8. The method of claim 1, further comprising the step of receiving a first semi-symbol from a first transmitter and a second semi-symbol of a second transmitter, wherein the ADC is coupled to a receiver of a pulse-based communication system, and the receiver is positioned at a desired position relative to the first and second transmitter to receive the first and second semi-symbol to form the complete signal, and the desired position is only position that receives the complete signal.

9. The method of claim 8, wherein the first and second transmitters are equidistant from the receiver.

10. The method of claim 8, wherein the first and second transmitters are positioned at different distances from the receiver, and the first transmitter transmits the first semi-symbol at a different time than the second transmitter transmits the second semi-symbol to allow the first and second semi-symbols to arrive at the receiver simultaneously.

11. The method of claim 1, further comprising the steps of:
receiving a first reflected signal transmitted from a first transmitter and reflected from an object and calculating a first total distance corresponding to a first travel distance between the first transmitter to the object and the object to a receiver;
receiving a second reflected signal transmitted from a second transmitter and reflected from the object and calculating a second total distance corresponding to a travel distance between the second transmitter to the object and the object to the receiver; and
plotting a first ellipse corresponding to the first total distance and a second ellipse corresponding to the second total distance, wherein an intersection point between the first and second ellipse indicates a position of the object.

12. A system for active cancellation for an analog to digital converter (ADC), the system comprising:
a differential pair block receiving an input signal of the ADC, wherein the differential pair block generates a negative signal that is a negative copy of the input signal;
a first transmission gate for receiving the input signal, wherein the first transmission gate is coupled to the differential pair block and is capable of switching between on and off states;
a second transmission gate for receiving the negative signal, wherein the second transmission gate is coupled to the differential pair block and remains in the off state; and
a buffer coupled to the first and second transmission gates, wherein the buffer receives combined output signals from the first and second transmission gates, and the output signals of the first and second transmission gates cancel out when both the first and second transmission gates are in the off state to mitigate a leakage effect.

13. The system of claim 12, wherein the negative signal is generated with a differential amplifier.

14. The system of claim 12, further comprising a signal conditioning block coupled to the differential pair block, wherein the signal conditioning block reduces a phase and amplitude imbalance of the input signal and the negative signal prior to the first transmission gate receiving the input signal and the second transmission gate receiving the negative signal.

15. The system of claim 14, wherein the signal conditioning block provides one or more stages of differential amplifiers and a voltage follower.

16. The system of claim 12, wherein the ADC is operable at input frequencies of 1 GHz or greater.

17. The system of claim 12, wherein the ADC is capable of providing sampling windows of 10 picoseconds or less.

18. The system of claim 12, wherein the buffer comprises a holding capacitor.

19. The system of claim 12, further comprising a pulsed-base communication system, wherein the pulse-based communication system comprises
a first transmitter transmitting a first semi-symbol;
a second transmitter transmitting a second semi-symbol, wherein the first and second semi-symbols are combined to form a complete signal; and
a receiver coupled to the differential pair block, first and second transmission gates, and buffer, wherein the receiver is positioned at a desired position relative to the first and second transmitter to receive the first and second semi-symbol to form the complete signal, and the desired position is only position that receives the complete signal.

20. The system of claim 19, wherein the first and second transmitters are equidistant from the receiver.

21. The system of claim 19, wherein the first and second transmitters are positioned at different distances from the receiver, and the first transmitter transmits the first semi-symbol at a different time than the second transmitter transmits the second semi-symbol to allow the first and second semi-symbols to arrive at the receiver simultaneously.

22. The system of claim 12, further comprising:
a first transmitter transmitting a first signal towards an object;
a second transmitter transmitting a second signal towards an object;
a receiver coupled to the ADC that receives the first signal reflected from the object, wherein the receiver receives the second signal reflected from the object; and
a processor coupled to the receiver, wherein the processor calculates a first total distance corresponding to a first travel distance between the first transmitter to the object and the object to a receiver, and the processor calculates a second total distance corresponding to a travel distance between the second transmitter to the object and the object to the receiver, and
the processor plots a first ellipse corresponding to the first total distance and a second ellipse corresponding to the second total distance, wherein an intersection point between the first and second ellipse indicates a position of the object.

* * * * *